United States Patent
Koshimizu et al.

(10) Patent No.: US 8,894,806 B2
(45) Date of Patent: Nov. 25, 2014

(54) PLASMA PROCESSING APPARATUS AND PLASMA PROCESSING METHOD

(75) Inventors: Chishio Koshimizu, Nirasaki (JP); Yohei Yamazawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1205 days.

(21) Appl. No.: 12/732,711

(22) Filed: Mar. 26, 2010

(65) Prior Publication Data

US 2010/0243606 A1 Sep. 30, 2010

Related U.S. Application Data

(60) Provisional application No. 61/242,626, filed on Sep. 15, 2009.

(30) Foreign Application Priority Data

Mar. 27, 2009 (JP) .................. 2009-079600

(51) Int. Cl.
- *C23C 16/50* (2006.01)
- *C23C 16/00* (2006.01)
- *H01L 21/306* (2006.01)
- *C23F 1/00* (2006.01)
- *H01J 37/32* (2006.01)

(52) U.S. Cl.
CPC ..... *H01J 37/32174* (2013.01); *H01J 37/32642* (2013.01); *H01J 37/32091* (2013.01)
USPC .................. 156/345.44; 156/345.51; 118/728

(58) Field of Classification Search
USPC .......... 118/715, 728–733; 156/345.51–345.55
See application file for complete search history.

(56) References Cited

U.S. PATENT DOCUMENTS

| | | | |
|---|---|---|---|
| 6,676,804 B1 | 1/2004 | Koshimizu et al. | |
| 2004/0261946 A1* | 12/2004 | Endoh et al. | 156/345.15 |
| 2005/0172904 A1* | 8/2005 | Koshimizu et al. | 118/728 |
| 2005/0178329 A1* | 8/2005 | Engle | 118/719 |
| 2006/0066247 A1* | 3/2006 | Koshiishi et al. | 315/111.21 |
| 2006/0196605 A1* | 9/2006 | Ikegami et al. | 156/345.51 |

FOREIGN PATENT DOCUMENTS

| | | |
|---|---|---|
| JP | 11-26563 A | 1/1999 |
| JP | 2005-277369 A | 10/2005 |
| JP | 2008-511166 A | 4/2008 |
| JP | 2008-244274 A | 10/2008 |
| WO | 2006/025942 A1 | 3/2006 |
| WO | 2007/095388 A2 | 8/2007 |

* cited by examiner

*Primary Examiner* — Rakesh Dhingra
*Assistant Examiner* — Tiffany Nuckols
(74) *Attorney, Agent, or Firm* — Rothwell, Figg, Ernst & Manbeck, P.C.

(57) ABSTRACT

A plasma processing apparatus includes a vacuum evacuable processing chamber; a lower electrode for mounting a target substrate in the processing chamber; a focus ring attached to the lower electrode to cover at least a portion of a peripheral portion of the lower electrode; an upper electrode disposed to face the lower electrode in parallel in the processing chamber; a processing gas supply unit for supplying a processing gas to a processing space; and a radio frequency (RF) power supply for outputting an RF power. Further, the plasma processing apparatus includes a plasma generating RF power supply section for supplying the RF power to a first load for generating a plasma of the processing gas; and a focus ring heating RF power supply section for supplying the RF power to a second load for heating the focus ring.

10 Claims, 20 Drawing Sheets

PLASMA PROCESSING APPARATUS AND PLASMA PROCESSING METHOD

CROSS-REFERENCE TO RELATED APPLICATIONS

This application claims priorities to Japanese Patent Application No. 2009-079600 filed on Mar. 27, 2009 and U.S. Provisional Application No. 61/242,626 filed on Sep. 15, 2009, the entire contents of which are incorporated herein by reference.

FIELD OF THE INVENTION

The present invention relates to a technique for performing a plasma process on a target substrate; and, more particularly, to a plasma processing apparatus in which a focus ring is attached to an electrode for supporting a substrate and a plasma processing method using the same.

BACKGROUND OF THE INVENTION

Generally, in a single-wafer plasma processing apparatus, a susceptor (lower electrode) and a facing electrode (upper electrode) have diameters larger than that of a target substrate mounted on the susceptor in a vacuum chamber in order to improve in-plane uniformity of a density of plasma applied to the surface of the target substrate (especially, uniformity of the substrate in a radial direction). In this case, when a peripheral portion of a top surface of the susceptor which is projected outwardly in the radial direction of the substrate is directly exposed to the plasma, the peripheral portion is damaged and deteriorated by ion bombardment from the plasma.

Especially, in a plasma etching apparatus, since ions are accelerated and attracted by using a self-bias voltage generated in the susceptor, an ion sputtering effect is large. Accordingly, the susceptor is protected from the plasma by detachably providing a ring-shaped covering member, i.e., a so-called focus ring, so as to cover the peripheral portion of the top surface of the susceptor which is projected outwardly in the radial direction of the substrate (see, e.g., Japanese Patent Application Publication No. 2000-36490 and corresponding U.S. Pat. No. 6,676,804).

The focus ring is preferably made of a material that can efficiently pass a radio frequency (RF) power to the susceptor and the plasma and have no substantial influence on the process performed on the substrate even though it is sputtered by ions. For example, in a plasma etching apparatus, the focus ring is made of Si, SiC, C (carbon), $SiO_2$, $Al_2O_3$ or the like.

Meanwhile, in the plasma processing apparatus, the temperature of the substrate has a large influence on a reaction on the surface of the substrate, etching characteristics, film characteristics and the like. Accordingly, the temperature of the substrate is controlled by a susceptor for mounting the substrate thereon. Generally, it is preferable to prevent the temperature of the substrate from being increased due to heat supplied from the plasma. Particularly, in a plasma etching process, a radical reaction is suppressed by decreasing the temperature of the substrate, thereby achieving high selectivity and vertical processability.

The temperature of the substrate is usually controlled by a cooling method in which a temperature-controlled coolant is supplied into and circulated along a coolant path provided in the susceptor from a chiller unit to cool the susceptor to a predetermined temperature, and a heat transfer gas such as He gas is supplied to a contact interface between the susceptor and the substrate to indirectly cool the substrate. The cooling method requires a holding unit for holding the substrate on the susceptor against a supply pressure of the heat transfer gas and an electrostatic chuck is widely used as the holding unit.

In a conventional plasma processing apparatus, the temperature of the substrate is controlled as described above, but an individual temperature control is not carried out on the focus ring. Accordingly, when the RF power is low, an ion flux is weak and the temperature of the focus ring has a temperature close to the temperature of the substrate which is mounted on the susceptor together with the focus ring.

However, when the temperature of the focus ring is low similarly to the temperature of the substrate, plasma process characteristics may be deteriorated. For example, in a photolithography, a multilayer resist process is widely used to improve miniaturization and resolution of a pattern. In the multilayer resist process, when etching of a bottom anti-reflection coating (BARC) film or an intermediate mask (mask process) is carried out, transfer accuracy, i.e., maintenance of the shape (prevention of damage and deformation) of a resist pattern provided at the top is regarded more important than the selectivity and vertical processability. Accordingly, the RF power used for plasma generation is set to be slightly low.

Further, when an RF power with a relatively low frequency is used to control ion attraction from the plasma to the substrate, the RF power for ion attraction is set to be still lower (extremely, 0 W). Accordingly, an amount of the heat supplied to the substrate from the plasma is small, and the temperature of the substrate is not very high, so that the temperature of the focus ring is low, similarly to the temperature of the substrate. However, in the etching process performed under the above-mentioned conditions, an etching rate in an edge portion of the substrate becomes relatively high compared to that in a central portion of the substrate, thereby causing nonuniform etching characteristics on the substrate.

As the results of experiments conducted to solve the above-mentioned problem, it has been found that an etching rate in an edge portion of the substrate is relatively suppressed and uniformity of etching characteristics is improved by increasing the temperature of the focus ring to be much higher than the temperature of the substrate.

However, in mass-produced apparatuses, installation of a heater for heating the focus ring at the susceptor is very difficult mechanically and causes an increase in the manufacturing cost. Further, the focus ring may be required to be cooled according to the process. For example, in the above-mentioned multilayer resist process, when a base film of a multilayer resist, i.e., a film to be processed, is etched after the mask process, the temperature of the focus ring is preferably decreased to obtain high selectivity and vertical processability.

As described above, a plasma processing apparatus for mass production requires a temperature controlling device capable of freely and easily controlling (particularly, increasing) the temperature of the focus ring.

SUMMARY OF THE INVENTION

In view of the above, the present invention provides a plasma processing apparatus capable of freely, easily and efficiently heating a focus ring attached to a susceptor (lower electrode) to surround a target substrate and controlling a temperature of the focus ring independently from a temperature of the susceptor.

Further, the present invention provides a plasma processing method for freely controlling the temperature of the focus ring in a multilayer resist process to improve uniformity of etching characteristics.

In accordance with a first aspect of the present invention, there is provided a plasma processing apparatus. The plasma processing apparatus includes: a vacuum evacuable processing chamber; a lower electrode for mounting a target substrate in the processing chamber; a focus ring mounted on the lower electrode to cover at least a portion of a peripheral portion of the lower electrode which is projected outwardly in a radial direction of the substrate; an upper electrode disposed to face the lower electrode in parallel in the processing chamber; a processing gas supply unit for supplying a processing gas to a processing space formed between the upper electrode and the lower electrode to perform a plasma process on the substrate; a radio frequency (RF) power supply for outputting an RF power of a frequency appropriate for gas RF discharge; a plasma generating RF power supply section for supplying the RF power outputted from the RF power supply to a first load for generating a plasma of the processing gas by RF discharge in the processing space in an impedance matching state; and a focus ring heating RF power supply section for supplying the RF power outputted from the RF power supply to a second load for heating the focus ring to a desired temperature in an impedance matching state.

With this configuration, the RF power outputted from the RF power supply for generating a plasma of the processing gas is also used to heat the focus ring. That is, when the processing gas is supplied from the processing gas supply unit to the processing space formed between both the electrodes, an RF transmission path from the lower electrode to the processing space forms the first load for plasma generation when it is seen from the RF power supply, and the RF power is supplied to the first load via the plasma generating RF power supply section. However, when the processing gas is not supplied to the processing space, the RF discharge does not occur (that is, the plasma is not generated) even though the RF power supply outputs the RF power. Accordingly, the first load substantially does not exist. In this case, the second load for heating the focus ring substitutes for the first load to serve as a substantial load applied to the RF power supply, and current of the RF power is flowed in the second load via the focus ring heating RF power supply section to heat the focus ring. The heat amount generated in the focus ring can be increased or decreased by varying the output power of the RF power supply.

In accordance with a second aspect of the present invention, there is provided a plasma processing apparatus. The plasma processing apparatus includes a vacuum evacuable processing chamber; a lower electrode for mounting a target substrate in the processing chamber; a focus ring mounted on the lower electrode to cover at least a portion of a peripheral portion of the lower electrode which is projected outwardly in a radial direction of the substrate; an upper electrode disposed to face the lower electrode in parallel in the processing chamber; a processing gas supply unit for supplying a processing gas to a processing space formed between the upper electrode and the lower electrode to perform a plasma process on the substrate; a first RF power supply for outputting a first RF power of a frequency appropriate for gas RF discharge; a plasma generating RF power supply section for supplying the first RF power outputted from the first RF power supply to a first load for generating a plasma of the processing gas by RF discharge in the processing space in an impedance matching state; a second RF power supply for outputting a second RF power of a frequency appropriate for ion attraction; an ion attracting RF power supply section for supplying the second RF power outputted from the second RF power supply to a second load for controlling ion attraction from the plasma to the substrate in an impedance matching state; and a focus ring heating RF power supply section for supplying the second RF power outputted from the second RF power supply to a third load for heating the focus ring to a desired temperature in an impedance matching state.

With this configuration, the first RF power outputted from the first RF power supply is used only to generate a plasma of the processing gas, whereas the second RF power outputted from the second RF power supply for controlling ion attraction from the plasma to the substrate is also used to heat the focus ring. That is, when the plasma is generated in the processing space between both the electrodes, an RF transmission path from the lower electrode to the processing space forms the second load for ion attraction when it is seen from the second RF power supply, and the second RF power is supplied to the second load via the ion attracting RF power supply section. However, when the processing gas is not supplied to the processing space (i.e., when the plasma is not generated), the ion attraction does not occur even though the second RF power supply outputs the second RF power. Accordingly, the second load substantially does not exist. In this case, the third load for heating the focus ring substitutes for the second load to serve as a substantial load applied to the second RF power supply, and current of the second RF power is flowed in the third load via the focus ring heating RF power supply section to heat the focus ring. The heat amount generated in the focus ring can be increased or decreased by varying the output power of the second RF power supply.

In accordance with a third aspect of the present invention, there is provided a plasma processing apparatus including: a vacuum evacuable processing chamber; an electrode for mounting a target substrate in the processing chamber; a focus ring mounted on the electrode to cover at least a portion of a peripheral portion of the electrode which is projected outwardly in a radial direction of the substrate; a plasma generating unit for generating a plasma of a processing gas in a processing space formed above the electrode in the processing chamber to perform a plasma process on the substrate; and a focus ring heating unit for supplying an RF power or alternating current to the focus ring to heat the focus ring to a desired temperature.

With this configuration, the focus ring heating unit used exclusively to heat the focus ring is provided. Accordingly, it is possible to increase the temperature of the focus ring independently of the temperature of the electrode regardless of whether the plasma exists or not in the processing space.

In accordance with a fourth aspect of the present invention, there is provided a plasma processing method for performing etching of a multilayer resist process on a target substrate by using the plasma processing apparatus described above. The method includes heating the focus ring to a certain temperature by applying an RF power or alternating current to the focus ring before or during the etching of the multilayer resist process.

As a result, the temperature of the focus ring can be freely increased or decreased. Accordingly, it is possible to optimally control the temperature of the focus ring in each etching step of a multilayer resist process, thereby improving uniformity of etching characteristics.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Hereinafter, embodiments of the present invention will be described with reference to the accompanying drawings which form a part hereof.

Figure 1:
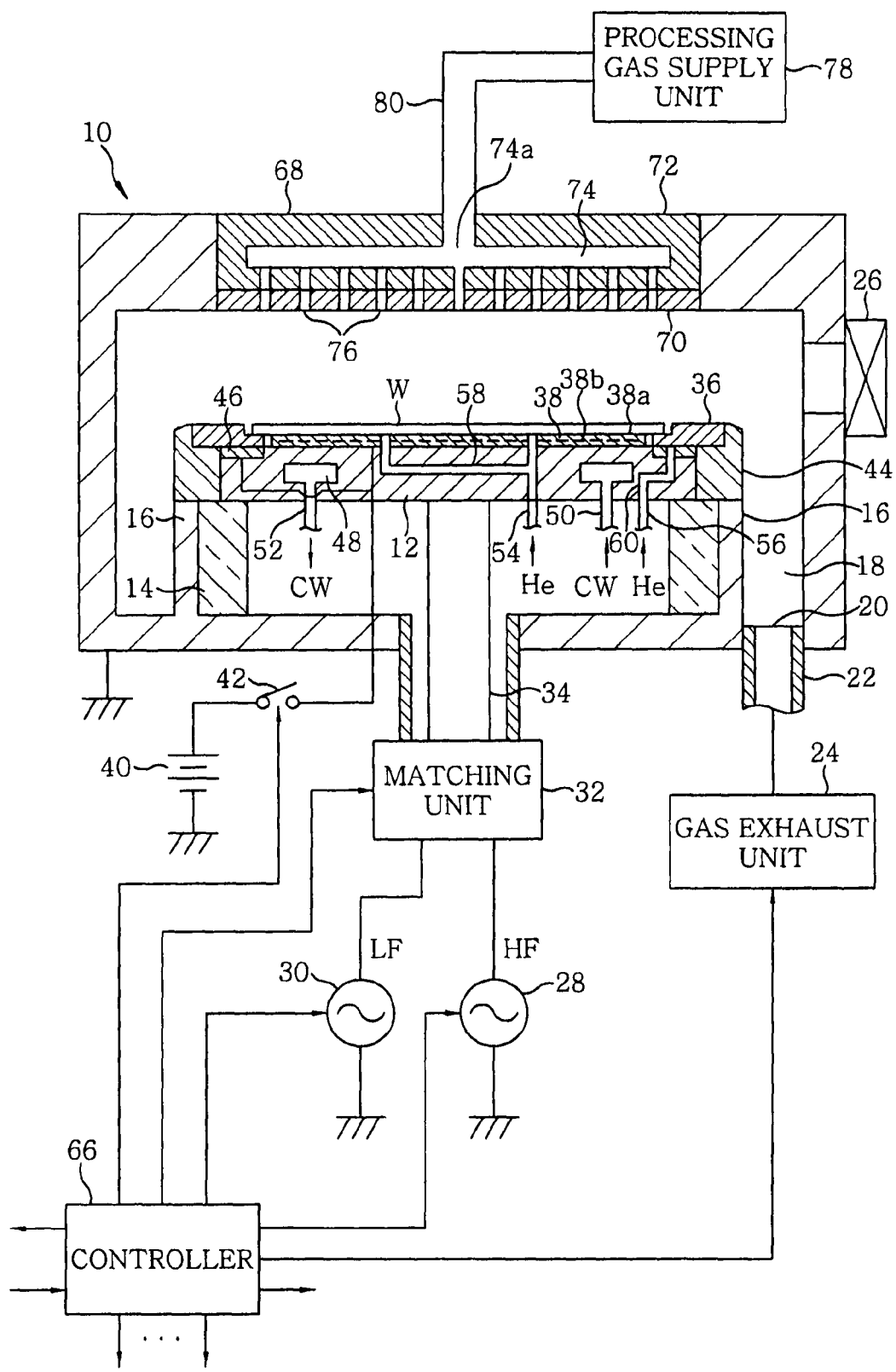
FIG. 1 illustrates a longitudinal cross sectional view of a capacitively coupled plasma processing apparatus in accordance with an embodiment of the present invention.
Figure 2:
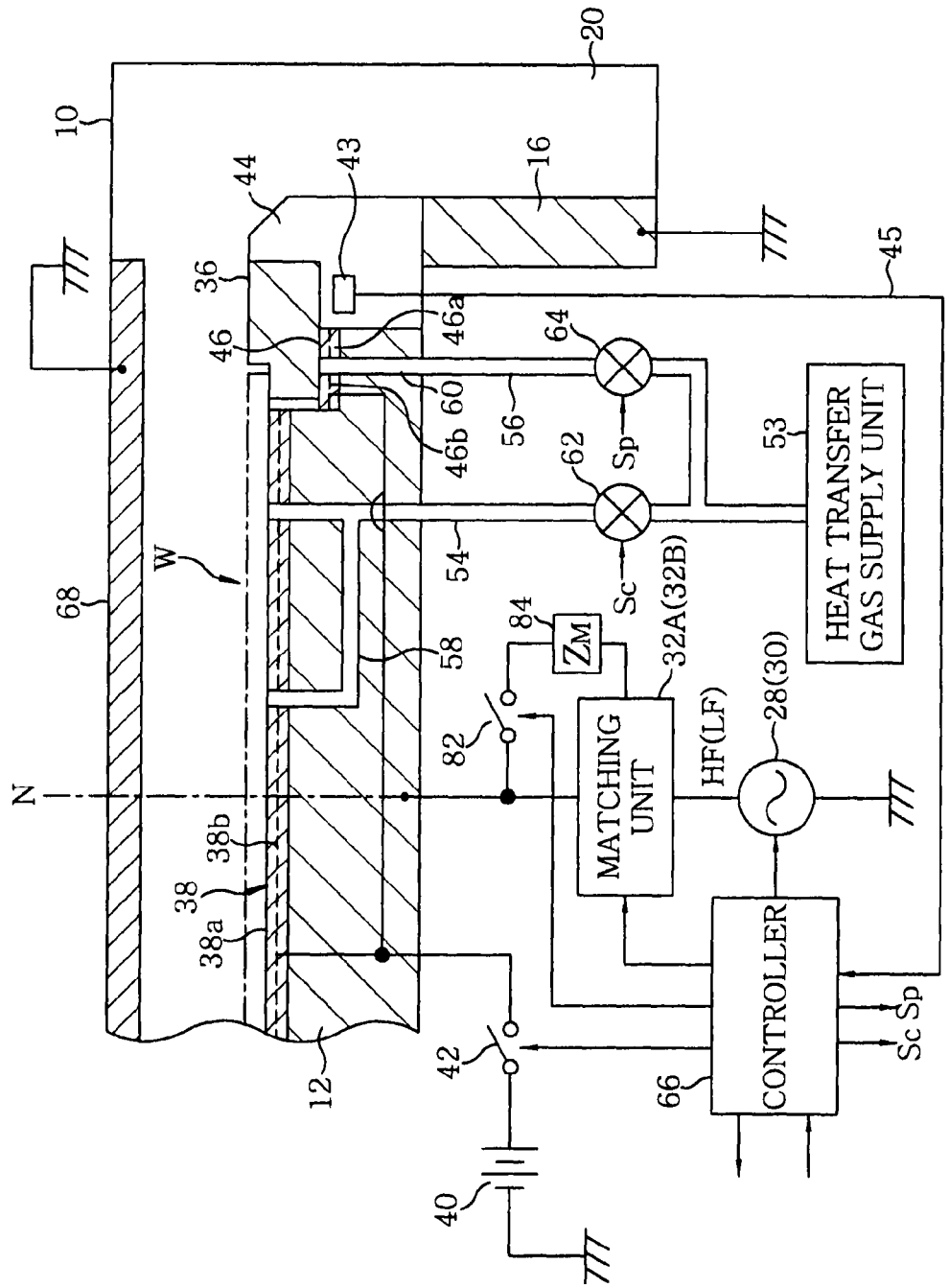
FIG. 2 shows main parts of the plasma processing apparatus of FIG. 1.

FIG. 1 illustrates a plasma processing apparatus in accordance with an embodiment of the present invention. FIG. 2 shows main parts of the plasma processing apparatus.

The plasma processing apparatus is configured as a lower plate dual RF application type capacitively coupled plasma etching apparatus in which two radio frequency powers are applied to the lower electrode. The plasma processing apparatus includes a cylindrical chamber (processing chamber) 10 made of metal such as aluminum or stainless steel. The chamber 10 is frame grounded.

A disc-shaped susceptor 12 serving as a lower electrode is horizontally disposed in the chamber 10 to mount a target substrate, e.g., a semiconductor wafer W thereon. The susceptor 12 is made of, e.g., aluminum. The susceptor 12 is supported by a cylindrical support 14 that extends vertically upward from a bottom portion of the chamber 10 and is made of an insulator such as ceramics. A cylindrical support 16 that extends vertically upward from the bottom portion of the chamber 10 and is made of a conductor such as aluminum is formed along an outer periphery of the cylindrical support 14. An annular gas exhaust path 18 is formed between the cylindrical support 16 and an inner wall of the chamber 10. A gas exhaust port 20 is provided at the bottom of the gas exhaust path 18.

The gas exhaust port 20 is connected to a gas exhaust unit 24 via a gas exhaust pipe 22. The gas exhaust unit 24 has a vacuum pump such as a turbo molecular pump, so that a processing space in the chamber 10 can be depressurized to a desired vacuum level. A gate valve 26 is mounted on a sidewall of the chamber 10 to open and close a loading/unloading port of the semiconductor wafer W.

First and second radio frequency (RF) power supplies 28 and 30 are electrically connected to the susceptor 12 via a matching unit 32 and a power feed rod 34. The first RF power supply 28 mainly outputs a first RF power HF of a specific frequency (e.g., 27 MHz or more) for plasma generation. The second RF power supply 30 mainly outputs a second RF power LF of a specific frequency (e.g., 13.56 MHz or less) for ion attraction to the semiconductor wafer W mounted on the susceptor 12.

The matching unit 32 includes a first matching unit 32A for matching an impedance of the first RF power supply 28 to an impedance of a plasma generation load (mainly, a lower electrode, a plasma, an upper electrode and a chamber). Further, the matching unit 32 includes a second matching unit 32B for matching an impedance of the second RF power supply 30 to an impedance of an ion attraction load (mainly, a lower electrode, a plasma, an upper electrode and a chamber).

The susceptor 12 has a larger diameter than that of the semiconductor wafer W. A top surface of the susceptor 12 is divided into two portions of a central portion, i.e., a wafer mounting portion, having substantially the same shape (circular shape) and the same size as those of the wafer W and an annular peripheral portion extending along the outside of the wafer mounting portion. The semiconductor wafer W that is an object to be processed is mounted on the wafer mounting portion. A ring-shaped plate, i.e., a focus ring 36, having an inner diameter larger than the diameter of the semiconductor wafer W is mounted on the annular peripheral portion.

A material of the focus ring 36 is preferably required to efficiently pass an RF power (HF and LF) to the susceptor 12 and the plasma, have no substantial influence on the process performed on the substrate even though it is sputtered by incident ions, and have an appropriate resistance to be heated by radio frequency heating. For example, the focus ring 36 is made of Si, SiC, C or the like. Further, the focus ring 36 may be made of $SiO_2$ or $Al_2O_3$ that is obtained by mixing an electrically conductive material with a dielectric material.

A main electrostatic chuck 38 for attracting and holding the wafer is disposed on the wafer mounting portion of the susceptor 12. The main electrostatic chuck 38 includes a circular film-shaped or plate-shaped dielectric body 38a and a sheet-shaped or mesh-shaped DC electrode 38b embedded in the dielectric body 38a. The main electrostatic chuck 38 is integrally formed with the susceptor 12 or integrally fixed to the susceptor 12. The DC electrode 38b is electrically connected to a DC power supply 40 provided at the outside of the chamber 10 via a high voltage line and a switch 42. A high DC voltage is applied to the DC electrode 38b from the DC power supply 40, so that the semiconductor wafer W can be attracted and held on the main electrostatic chuck 38 by a Coulomb force.

A ring-shaped peripheral dielectric member 44 is provided outwardly in a radial direction from the susceptor 12 to surround the susceptor 12. The peripheral dielectric member 44 is interposed between an outer peripheral surface and an outer bottom portion (from the center in a radial direction to the outer edge) of the focus ring 36 and the top surfaces of the cylindrical supports 14 and 16. The peripheral dielectric member 44 is made of, e.g., quartz.

As shown in FIG. 2, a temperature sensor 43 may be provided inside or in the vicinity of the peripheral dielectric member 44 to detect the temperature of the focus ring 36. For example, a fluorescent thermometer (product name: Luxtron), a pyroelectric infrared sensor or the like may be used as the temperature sensor 43. In case of using the pyroelectric infrared sensor, a neighborhood of a detection point of the bottom surface of the focus ring 36 may be colored in black or the like. An output signal of the temperature sensor 43 is a feedback signal in temperature control of the focus ring 36 to be transmitted to a controller 66 via a signal line 45.

An inner bottom portion (from the inner edge to the center in a radial direction) of the focus ring 36 is mounted on a peripheral electrostatic chuck 46 that is provided at an annular peripheral portion of the top surface of the susceptor 12. The peripheral electrostatic chuck 46 includes an annular film-shaped or plate-shaped dielectric body 46a and a DC electrode 46b embedded in the dielectric body 46a. The DC electrode 46b is also electrically connected to the DC power supply 40 via the switch 42. A DC voltage is applied to the DC electrode 46b from the DC power supply 40, so that the focus ring 36 can be attracted and held on the peripheral electrostatic chuck 46 by an electrostatic adsorptive force.

In this embodiment, both the main electrostatic chuck 38 and the peripheral electrostatic chuck 46 are connected to the same DC power supply 40 via the switch 42, and an adsorptive force is generated in both the main electrostatic chuck 38 and the peripheral electrostatic chuck 46 at the same time. However, the electrostatic chucks 38 and 46 may be selectively or individually operated by using respective switches or respective DC power supplies.

A coolant path 48 having, e.g., a ring shape extending in a circumferential direction is provided in the susceptor 12. A coolant (e.g., cooling water) of a specific temperature is supplied into and circulated along the coolant path 48 from a chiller unit (not shown) via coolant supply tubes 50 and 52. Accordingly, the temperature of the susceptor 12 can be controlled to be decreased by the temperature of the coolant.

Further, in order to thermally couple the semiconductor wafer W and the focus ring 36 with the susceptor 12, a heat transfer gas from a heat transfer gas supply unit 53, e.g., He gas, is supplied to a contact interface between the main electrostatic chuck 38 and the semiconductor wafer W and a contact interface between the peripheral electrostatic chuck 46 and the focus ring 36 via respective gas supply lines 54 and 56 and respective gas channels 58 and 60 provided inside the susceptor 12.

In this embodiment, as shown in FIG. 2, valves 62 and 64 are provided in the gas supply lines 54 and 56. The valves 62 and 64 are independently turned on and off by control signals $S_c$ and $S_p$ from the controller 66.

A shower head 68 also serving as an upper electrode having a ground potential to face the susceptor 12 in parallel is disposed at a ceiling portion of the chamber 10. The shower head 68 includes an electrode plate 70 facing the susceptor 12 and an electrode holder 72 which detachably supports the electrode plate 70 from a rear (upper) side thereof. A gas chamber 74 is disposed inside the electrode holder 72.

A plurality of gas discharge holes 76 directed from the gas chamber 74 toward the susceptor 12 are formed to pass through the electrode holder 72 and the electrode plate 70. A space between the electrode plate 70 and the susceptor 12 is a plasma generation space or processing space. A gas inlet port 74a is disposed at an upper portion of the gas chamber 74. The gas inlet port 74a is connected to a processing gas supply unit 78 via a gas supply pipe 80. Further, the electrode plate 70 is formed of, e.g., Si or SiC, and the electrode holder 72 is made of, e.g., alumite treated aluminum.

In this embodiment, in order to control the temperature of the focus ring 36, as shown in FIG. 2, the matching unit 32 is provided with an impedance additional circuit 84 which can be connected in series or in parallel to any one of the first matching unit 32A and the second matching unit 32B via the switch 82. The impedance additional circuit 84 is an additional circuit for controlling a matching point.

For instance, the impedance additional circuit 84 is configured to be connected to the first matching unit 32A for plasma generation via the switch 82. In this configuration, when the focus ring 36 is heated, the controller 66 turns on the switch 82 such that the impedance additional circuit 84 is connected to the first matching unit 32A. Otherwise, particularly, when a dry etching process is performed on the semiconductor wafer W mounted on the susceptor 12, the controller 66 turns off the switch 82 such that impedance additional circuit 84 is electrically separated from the first matching unit 32A. The operation of the impedance additional circuit 84 will be described later.

The controller 66 controls each component of the plasma etching apparatus, e.g., the gas exhaust unit 24, the first and second RF power supplies 28 and 30, the first and second matching units 32A and 32B, the switch 42 for the electrostatic chuck, the chiller unit (not shown), the valves 62 and 64 for supply of the heat transfer gas, the processing gas supply unit 78, the switch 82 for control of the matching point or the like. The controller 66 has a microcomputer. The controller 66 receives and sends a control signal or data from/to an external apparatus such as a host computer (not shown). Particularly, in this embodiment, the controller 66 is equipped with software for optimally controlling the temperature of the focus ring 36 that is heated by radio frequency heating independently from the temperature of the susceptor 12 by balancing the heating of the focus ring 36 with the cooling of the susceptor 12.

A single-wafer dry etching process in the plasma etching apparatus is performed as follows. First, the gate valve 26 is opened and the semiconductor wafer W to be processed is loaded into the chamber 10 and mounted on the main electrostatic chuck 38. Then, an etching gas (in general, a gaseous mixture) is introduced from the processing gas supply unit 78 into the chamber 10 maintained in a sealed state at a specific flow rate and a specific flow rate ratio. Then, an inner pressure of the chamber 10 is adjusted to a set value by the gas exhaust unit 24.

Further, the first and second RF power supplies 28 and 30 are turned on to output a first RF power HF and a second RF power LG at respective specific power levels. The RF powers HF and LF are applied to the susceptor 12 via the matching unit 32 and the power feed rod 34. Further, the valve 62 for supply of the heat transfer gas is turned on to supply a heat transfer gas, e.g., He gas, to a contact interface between the main electrostatic chuck 38 and the semiconductor wafer W.

At the same time, the switch 42 for the electrostatic chuck is turned on to confine the heat transfer gas to the contact surface by the electrostatic adsorptive force. The etching gas discharged from the shower head 68 is converted into a plasma between the electrodes 12 and 68 by a radio frequency discharge. Then, a target film on the surface of the semiconductor wafer W is etched in a desired pattern by radicals or ions produced in the plasma.

In the plasma etching apparatus, by applying to the susceptor 12 the first RF power HF of a relatively high frequency (27 MHz or more) suitable for plasma generation, a plasma is highly densified in a desired dissociation state so that a high-density plasma can be generated even at a low pressure. Also, by applying to the susceptor 12 the second RF power LF of a relatively low frequency (13.56 MHz or less) suitable for ion attraction, anisotropic etching can be performed on the semiconductor wafer W mounted on the susceptor 12 with high selectivity. The first RF power HF for plasma generation is certainly used in the etching process, but the second RF power LF for ion attraction may not be used according to the type of the process.

Further, in the plasma etching apparatus, the main electrostatic chuck 38 and the peripheral electrostatic chuck 46 for attracting and holding the semiconductor wafer W and the focus ring 36 respectively are provided on the susceptor 12. Further, a heat transfer gas is independently supplied from the heat transfer gas supply unit 53 to each of the contact interface between the main electrostatic chuck 38 and the semiconductor wafer W via the valve 62 and the contact interface between the peripheral electrostatic chuck 46 and the focus ring 36 via the valve 64.

In this case, the valve 62 provided on the side of the main electrostatic chuck 38 is surely turned on to control (decrease) the temperature of the semiconductor wafer W in the etching process, but the valve 64 provided on the side of the peripheral electrostatic chuck 46 may be turned off during the etching process according to the type of the process.

Hereinafter, a configuration and an effect of a focus ring heating device in the plasma etching apparatus in accordance with the embodiment of the present invention will be described in detail.

In the plasma etching apparatus, when the etching gas is supplied from the processing gas supply unit 78 to the processing space between the electrodes 12 and 68, a HF transmission path ranging from the susceptor (lower electrode) 12 to the inner wall of the chamber 10 and the shower head (upper electrode) 68 having a ground potential through the processing space (etching gas space) forms a plasma generation load 90 when it is seen from the first RF power supply 28 and the first matching unit 32A.

Figure 3:
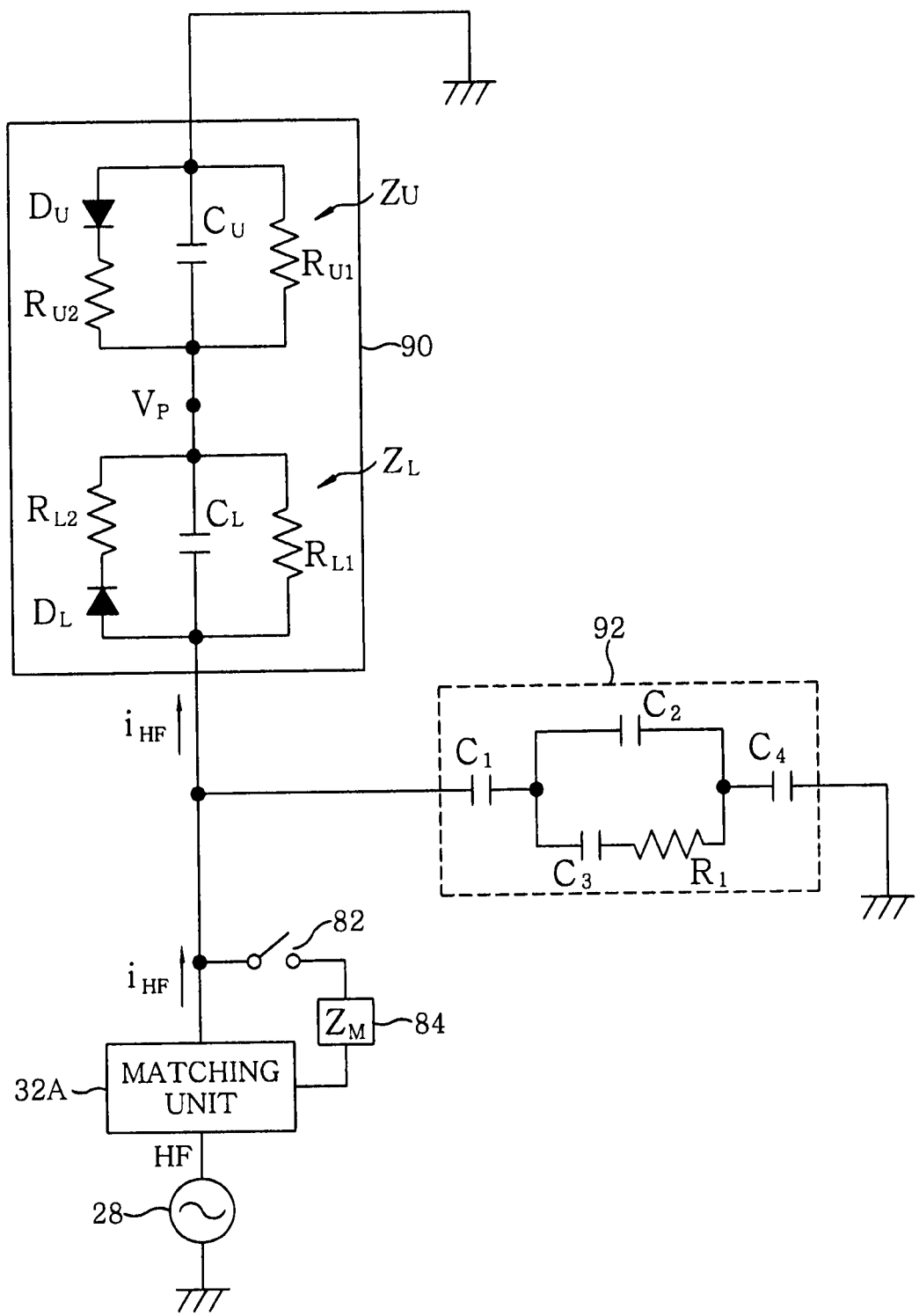
FIG. 3 illustrates an equivalent circuit of a plasma generation load in accordance with the embodiment of the present invention.

FIG. 3 illustrates an equivalent circuit of the plasma generation load 90. The plasma generation load 90 is represented by an impedance circuit $Z_L$ of an ion sheath on the cathode side and an impedance circuit $Z_U$ of an ion sheath on the anode side, which are connected to each other in series, wherein the impedance circuit $Z_L$ is formed between the plasma and the susceptor 12 (specifically, the semiconductor wafer W and the focus ring 36), and the impedance circuit $Z_U$ is formed between the plasma and the inner wall of the chamber 10 and the shower head (upper electrode) 68 having a ground potential.

The impedance circuit $Z_L$ of the cathode side ion sheath is represented by a circuit including a resistor $R_{L1}$, a capacitor $C_L$ and a diode-resistor series circuit $D_L$-$R_{L2}$ which are connected to one another in parallel. Further, impedance circuit $Z_U$ of the anode side ion sheath is represented by a circuit including a resistor $R_{U1}$, a capacitor $C_U$ and a diode-resistor series circuit $D_U$-$R_{U2}$ which are connected to one another in parallel.

Meanwhile, a peripheral path ranging from the susceptor 12 to the cylindrical support 16 having a ground potential through the focus ring 36 and the peripheral dielectric member 44 when it is seen from the first RF power supply 28 and the first matching unit 32A may also serve as the HF transmission path. Further, the cylindrical support 16 has a low impedance to RF, and may not be directly grounded if it is connected to a ground potential with a large electrostatic capacitance. In this embodiment, the peripheral HF transmission path is used as the focus ring heating load 92.

As shown in FIG. 3, an equivalent circuit of the focus ring heating load 92 generally includes capacitors C1, C2, C3 and C4 and a resistor R1. The capacitor C1 is a capacitance between the susceptor 12 and the focus ring 36 (mainly, a capacitance of the peripheral electrostatic chuck 46). A parallel circuit of the capacitor C2 and a capacitor-resistor series circuit C3-R1 represents an impedance of the focus ring 36. The capacitor C4 is a capacitance between the focus ring 36 and the cylindrical support 16 having a ground potential (mainly, a capacitance of the peripheral dielectric member 44).

Above all, in the focus ring heating load 92, the capacitance of the capacitor C4 corresponding to the peripheral dielectric member 44 is relatively very small (that is, a reactance is very large) in the RF transmission path in the apparatus. Accordingly, the impedance of the focus ring heating load 92 is remarkably large, substantially infinite, when it seen from the first RF power supply 28 and the first matching unit 32A if the plasma generation load 90 exists (that is, during the plasma etching process). Thus, all or most of the current $i_{HF}$ of the first RF power HF from the first RF power supply 28 flows entirely or mostly in the plasma generation load 90 through the first matching unit 32A. In this case, the RF current $i_{HF}$ hardly flows in the focus ring heating load 92. Joule heat generated in the resistor R1 of the focus ring 36 is neglectably small.

The first matching unit 32A includes a matching circuit including two variable capacitors $C_A$ and $C_B$, an $R_F$ sensor, a controller, a stepping motor and the like although not shown in the drawing. In order to minimize the power reflected from the load, the first matching unit 32A has an automatic matching function for automatically controlling capacitance positions of the variable capacitors $C_A$ and $C_B$ and automatically controlling the matched positions according to variation of the load.

In the plasma etching apparatus, although the first matching unit 32A is operated by turning on the first RF power supply 28, the RF discharge does not occur (that is, the plasma is not generated) unless an etching gas is supplied to the processing space in the chamber 10. Accordingly, the ion sheath is not formed, and the plasma generation load 90 substantially does not exist. In this case, the focus ring heating load 92 substitutes for the plasma generation load 90 to serve as a substantial load applied to the first RF power supply 28, and the first matching unit 32A is operated to match an impedance of the first RF power supply 28 to an impedance of the focus ring heating load 92.

Figure 4:
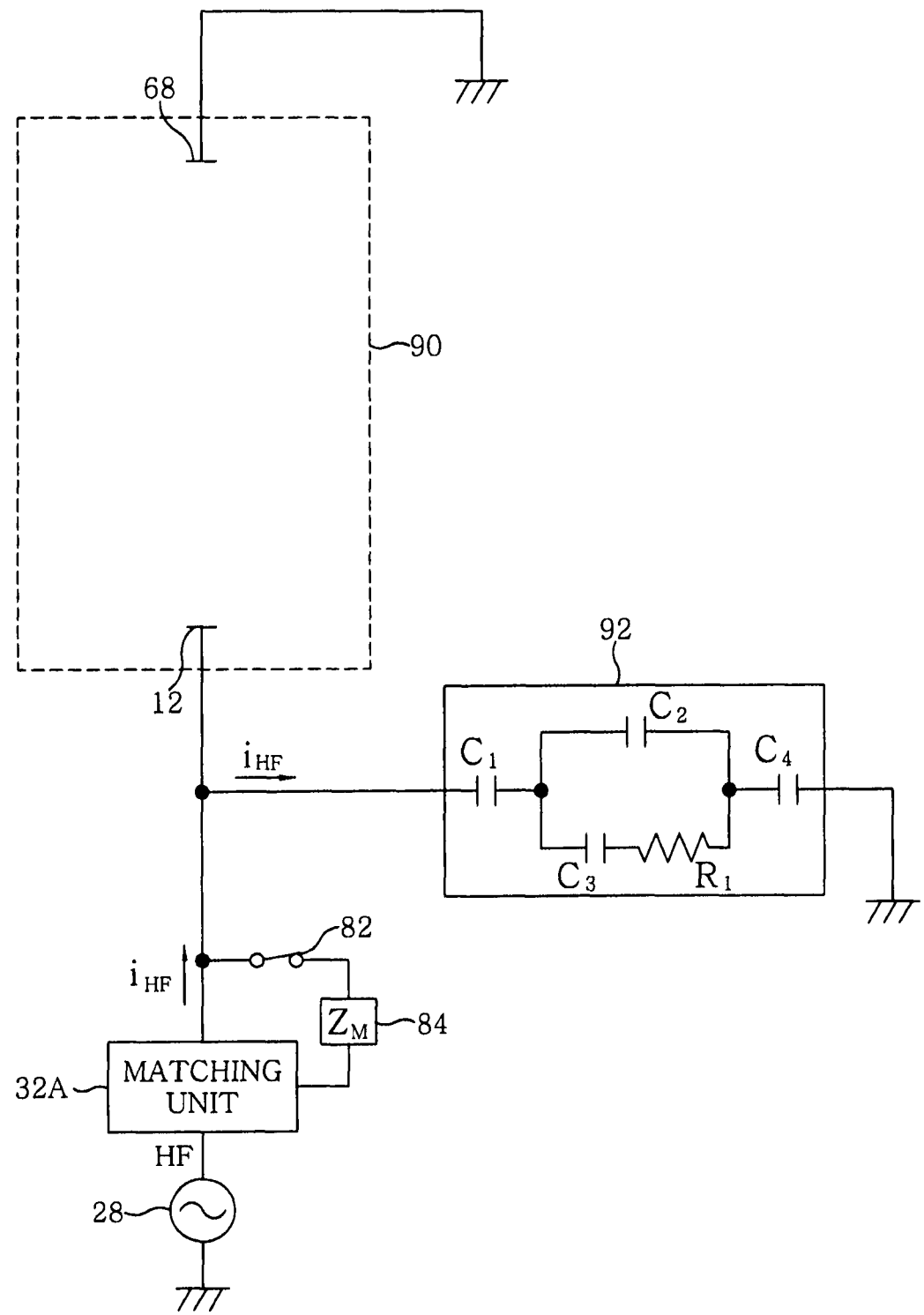
FIG. 4 illustrates an equivalent circuit of a focus ring heating load in accordance with the embodiment of the present invention.

Accordingly, as shown in FIG. 4, all or most of the RF current $i_{HF}$ from the first RF power supply 28 flows to the focus ring heating load 92 through the first matching unit 32A. In this case, the focus ring 36 is heated by Joule heat generated in the resistor R1. The generated heat amount can be increased or decreased by varying the output power of the first RF power supply 28. Consequently, the temperature of the focus ring 36 can be increased freely and independently from the temperature of the susceptor by RF heating using the first RF power HF applied from the first RF power supply 28.

In this embodiment, when the first RF power HF applied from the first RF power supply 28 is used to heat the focus ring 36, as described above, the switch 82 is turned on such that the impedance additional circuit 84 is connected to the first matching unit 32A in series or in parallel.

The impedance additional circuit 84 has a single or plural capacitor(s) and/or inductor(s), and is connected to the matching circuit of the first matching unit 32A to form a part of a matching network. Further, an impedance $Z_M$ of the impedance additional circuit 84 is set such that a matching point obtained in the first matching unit 32A connected to the impedance additional circuit 84, when the first RF power HF is used for heating of the focus ring 36, is close to a matching point obtained in the first matching unit 32A separated from the impedance additional circuit 84 when the first RF power HF is used for plasma generation.

Accordingly, the first matching unit 32A hardly or slightly changes a matching point although a substantial load applied to the first RF power supply 28 is switched from the plasma generation load 90 to the focus ring heating load 92 or from the focus ring heating load 92 to the plasma generation load 90, thereby achieving instant and stable matching.

In this embodiment, an impedance of the focus ring heating load 92 can be varied, particularly, preferably decreased when the first RF power HF is used for heating of the focus ring 36. Specifically, the capacitor $C_4$ corresponding to the peripheral dielectric member 44 in the focus ring heating load 92 may be configured as a variable capacitor.

Figure 5A:
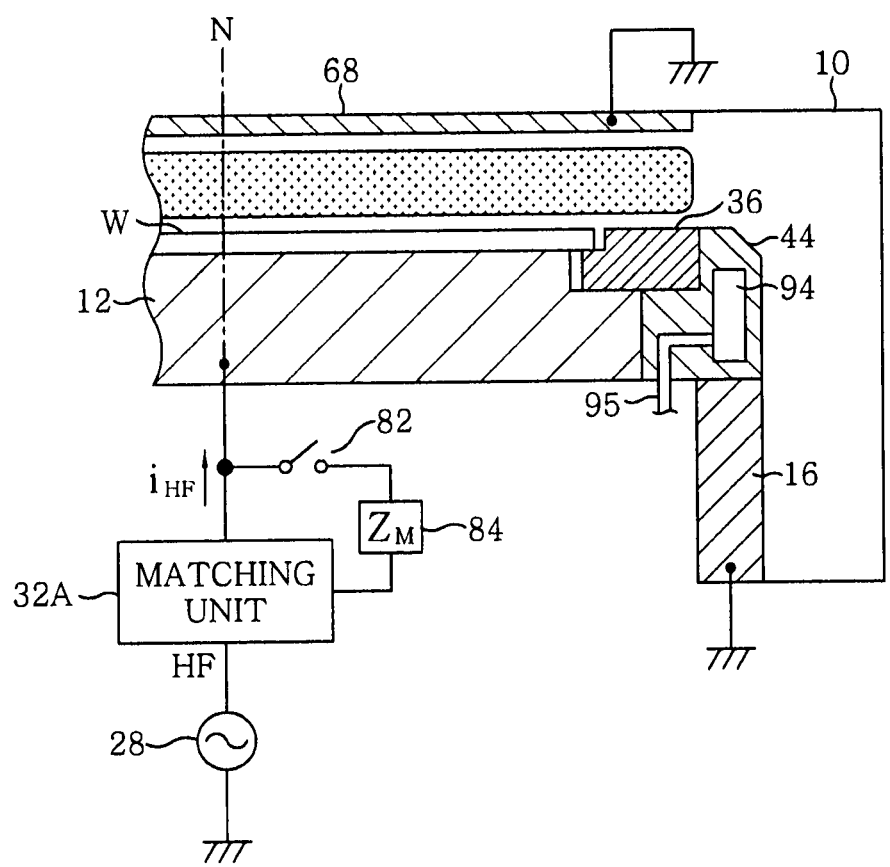
FIG. 5A illustrates an example in which a variable capacitor is provided in the focus ring heating load.
Figure 5B:
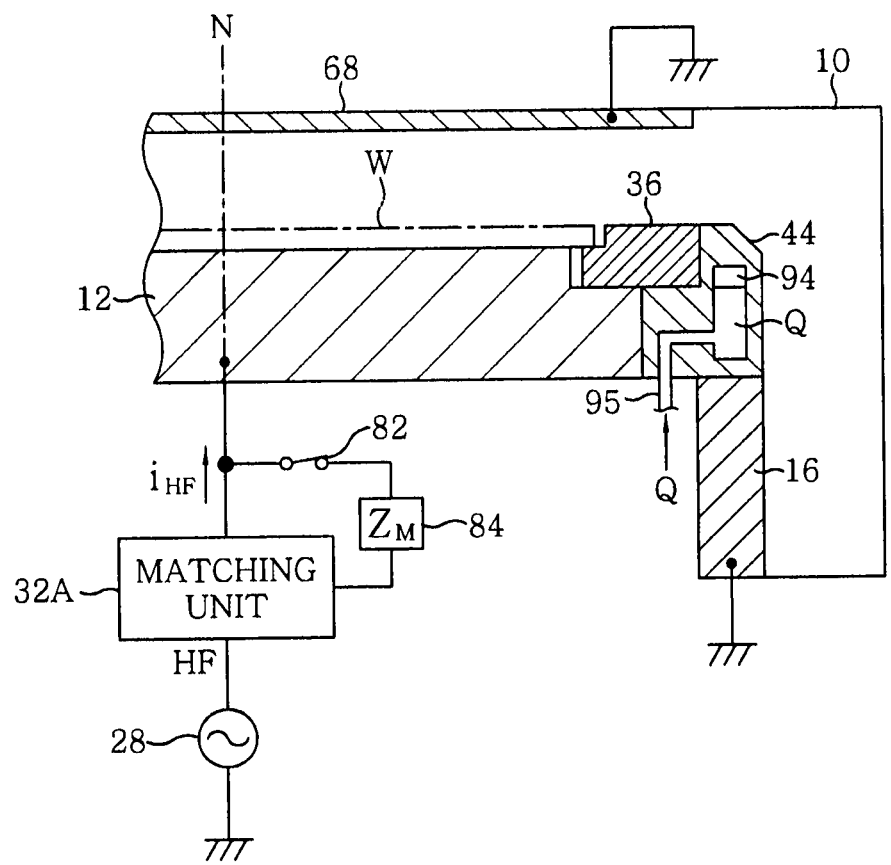
FIG. 5B illustrates a state in which the capacitance of the variable capacitor is increased in the example of FIG. 5A.

For instance, as shown in FIGS. 5A and 5B, an annular cavity 94 may be formed in the peripheral dielectric member 44 such that a dielectric liquid Q having a high dielectric constant such as Garden or Fluorinert and variable in volume can be contained in the cavity 94. In this example, the capacitance of the capacitor $C_4$ increases as the volume of the dielectric liquid Q contained in the cavity 94 increases, whereas the capacitance of the capacitor $C_4$ decreases as the volume of the dielectric liquid Q contained in the cavity 94 decreases. Further, a line 95 may be connected between a tank (not shown) provided at the outside of the chamber 10 and the cavity 94 in order to supply or drain the dielectric liquid Q into or from the cavity 94.

In this example, when the first RF power HF is used for heating of the focus ring 36, the dielectric liquid Q is filled in the cavity 94 to increase the capacitance of the capacitor $C_4$. Accordingly, the focus ring heating load 92 has a lower impedance to allow the RF current iHF to flow therein. By varying the volume of the dielectric liquid Q in the cavity 94, it is possible to vary the impedance of the focus ring heating load 92 and a heat generation amount of the focus ring 36.

Further, when the first RF power HF is used for plasma generation, the dielectric liquid Q is drained from the cavity 94 to reduce the capacitance of the capacitor $C_4$. Accordingly, the focus ring heating load 92 has a higher impedance to allow the RF current $i_{HF}$ to hardly flow therein.

Figure 6:
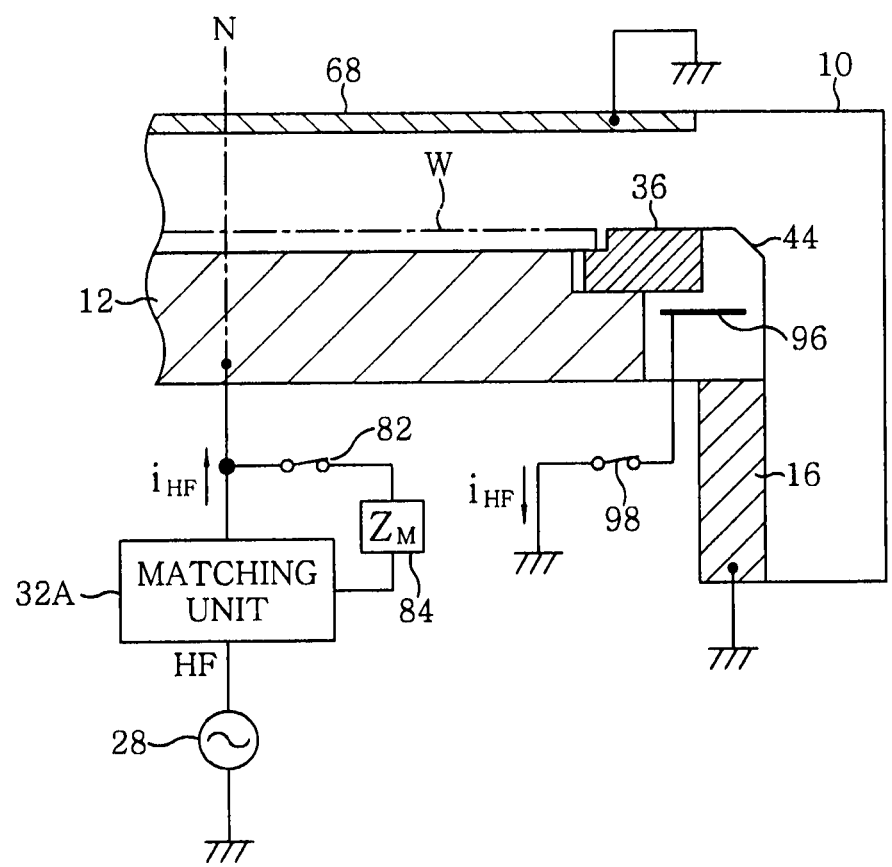
FIG. 6 illustrates another example in which a variable capacitor is provided in the focus ring heating load.

FIG. 6 illustrates another example in which the capacitor $C_4$ of the focus ring heating load 92 is configured as a variable capacitor. In this example, an annular ground electrode 96 is embedded in the peripheral dielectric member 44 to be preferably close to the focus ring 36 and a switch is provided between the ground electrode 96 and a conductive member having a ground potential (e.g., the chamber 10). The controller 66 turns off the switch 98 when the first RF power HF is used for plasma generation, and turns on the switch 98 when the first RF power HF is used for heating of the focus ring 36.

When the switch 98 is turned off, the ground electrode 96 is in an electrically floating state, and the capacitance of the capacitor $C_4$ is the same as that when there is no ground electrode 96 in the peripheral dielectric member 44. When the switch 98 is turned on, the ground electrode 96 is grounded. Accordingly, a distance between electrodes in the capacitor $C_4$ sharply decreases and the capacitance of the capacitor $C_4$ sharply increases correspondingly.

Figure 7:
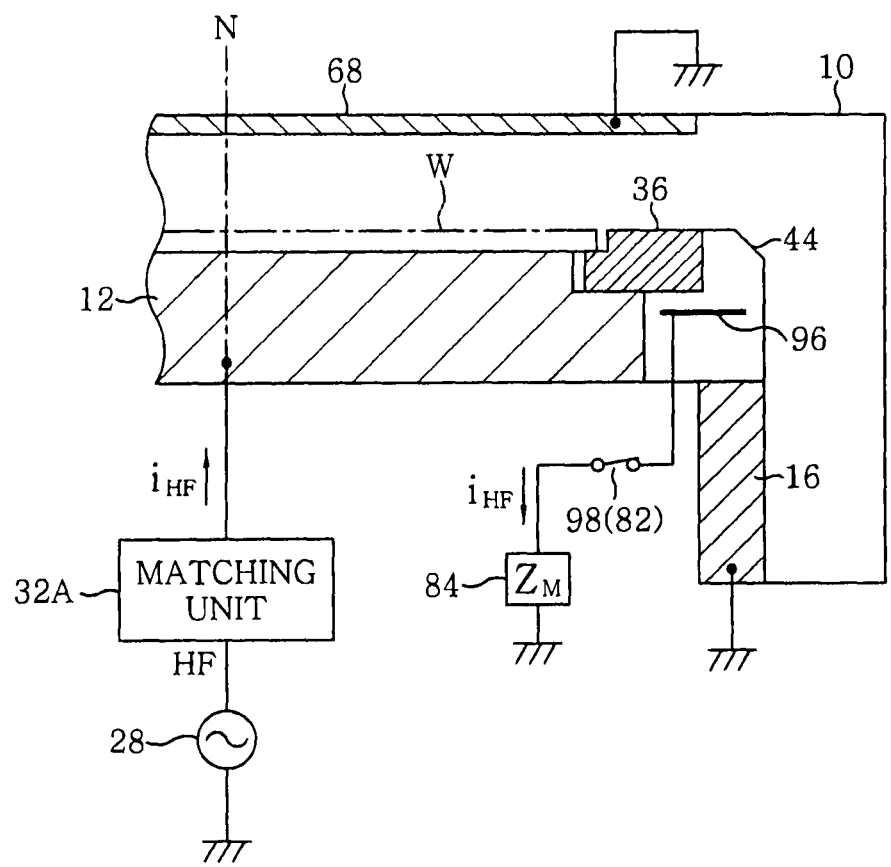
FIG. 7 illustrates a modification example of the example of FIG. 6.

Further, as shown in FIG. 7, the impedance additional circuit 84 for reducing variation of the matching point of the first matching unit 32A may be connected between the ground electrode 96 and a member having a ground potential. In this case, the switch 98 can also serve as the switch 82 for the impedance additional circuit 84.

Next, an application example using the plasma etching apparatus in accordance with the embodiment of the present invention will be described with reference to FIGS. 8A and 9.

Figure 8A:
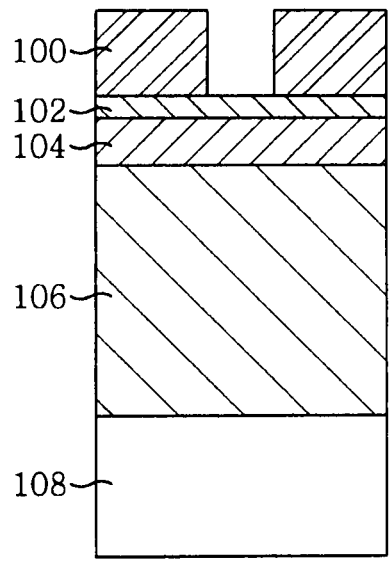
FIGS. 8A to 8D are cross sectional views for explaining steps of a multilayer resist process included in a High Aspect Ratio Contact (HARC) process.

FIGS. 8A to 8D illustrate steps of a multilayer resist process included in a High Aspect Ratio Contact (HARC) process. In FIG. 8A, a first film 100 provided at the top is a general resist and patterned by photolithography, and a second film 102 is a bottom anti-reflection coating (BARC) film. Further, a third film 104 is an SiN film serving as an intermediate mask, and a fourth film 106 is an $SiO_2$ layer of an insulating film that is a target film to be processed. Reference numeral '108' indicates a base substrate.

Figure 8B:
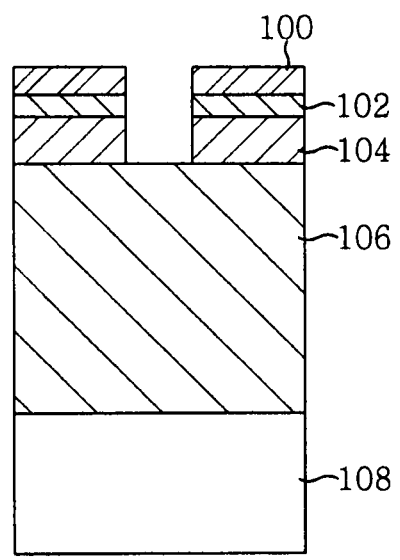

In the multilayer resist process, first, a mask process is performed such that the BARC 102 and the SiN film 104 are sequentially etched by using the resist pattern 100 as an etching mask (FIG. 8A→FIG. 8B). In the BARC etching and SiN etching of the mask process, transfer accuracy, i.e., maintenance of the shape (prevention of damage and deformation) of the resist pattern 100 provided at the top is regarded important. Accordingly, the first RF power HF for plasma generation is set to be slightly low (e.g. 1000 W or less), and the second RF power LF for ion attraction is set to be still lower (e.g. 100 W or less).

Figure 8C:
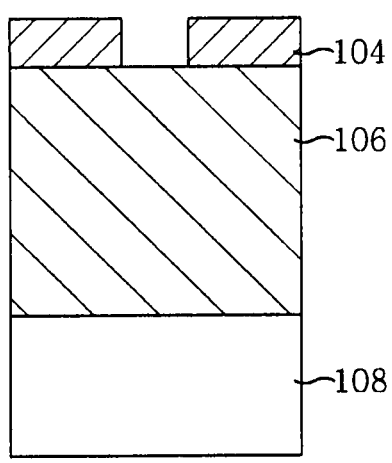
Figure 8D:
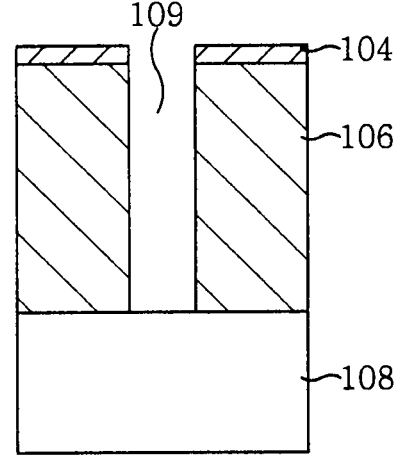

After the mask process, residues of the resist pattern 100 and the BARC film 102 are removed by ashing (FIG. 8C). Then, the $SiO_2$ layer is anisotropically etched by using the SiN film 104 as an etching mask to form a contact hole 109 (FIG. 8D).

Figure 9:
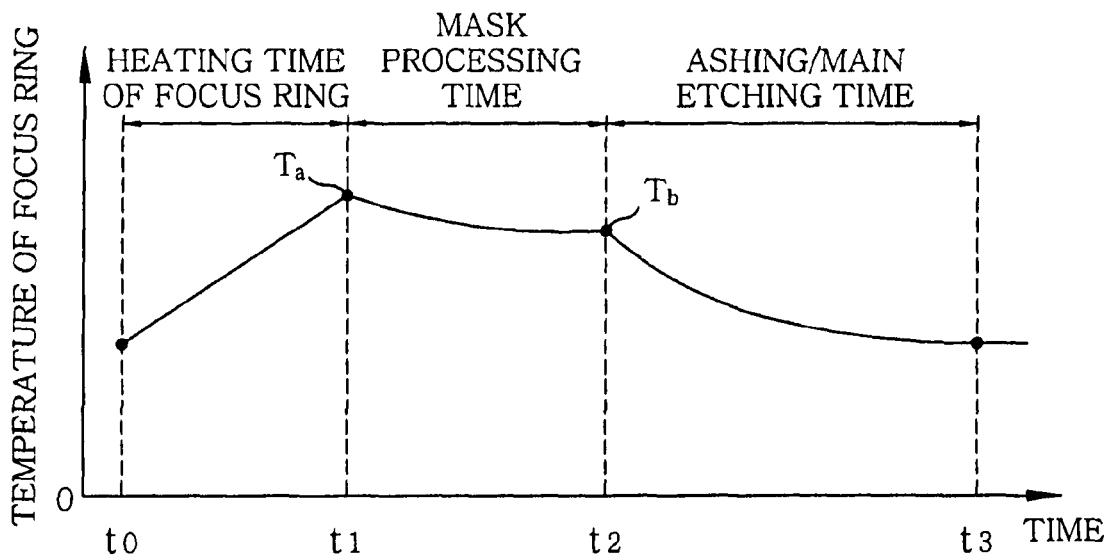
FIG. 9 shows an example of temperature characteristics when the temperature of the focus ring is individually controlled in the multilayer resist process.

In the above-described multilayer resist process, the temperature of the focus ring 36 can be individually controlled, for example, as shown in FIG. 9.

Specifically, when a starting point of the mask process is $t_1$, the focus ring 36 is heated by RF heating using the first RF power HF for a specific time period from $t_0$ to $t_1$ right before the mask process, so that the temperature of the focus ring 36 is increased to a predetermined temperature $T_a$. During the heating period of the focus ring, as described above, the operation of the processing gas supply unit 78 is stopped and the switch 42 for the electrostatic chuck and the valves 62 and 64 of a heat transfer gas supply system are turned off to stop a cooling device of the focus ring 36. In order to accurately control the temperature of the focus ring 36, the temperature of the focus ring 36 obtained by the temperature sensor 43 may be transmitted to the controller 66. Further, during the heating period of the focus ring, the semiconductor wafer W may be placed in a certain position, for example, may be loading into the chamber 10.

After the mask process is started at a time point $t_1$, the heating of the focus ring 36 is stopped and the first RF power HF applied from the first RF power supply 28 may be used for dry etching, i.e., plasma generation. Further, during the BARC etching and SiN etching of the mask process, the switch 42 for the electrostatic chuck and the valve 62 of the heat transfer gas supply system are turned on to operate a cooling device for the semiconductor wafer W mounted on the main electrostatic chuck 38 by thermally coupling the semiconductor wafer W with the susceptor 12. Further, the valve 64 of the heat transfer gas supply system is turned off to stop the supply of the heat transfer gas to the focus ring 36. Accordingly, since the focus ring 36 is not thermally coupled with the susceptor 12, the temperature of the focus ring 36 is prevented as far as possible from being reduced from an initial temperature $T_a$ right before the mask process.

Meanwhile, during the mask process, the temperature of the semiconductor wafer W mounted on the susceptor 12 is controlled by a balance between heating caused by the plasma and cooling caused by the susceptor 12. In the example, the temperature ($T_a \sim T_b$) of the focus ring 36 can be controlled to be maintained at a much or appropriately higher temperature than the temperature of the semiconductor wafer W during the mask processing time period ($t_1 \sim t_2$). Accordingly, an etching rate at an edge portion of the semiconductor wafer W is relatively suppressed to thereby improve in-plane uniformity of etching characteristics.

After the mask process, during ashing and $SiO_2$ etching (main etching) time period ($t_2 \sim t_3$), the switch 42 for electrostatic chuck and both the valves 62 and 64 of the heat transfer gas supply system are maintained in an on state. Further, a cooling device of the focus ring 36 may be operated by thermally coupling the focus ring 36 with the susceptor 12. Accordingly, the temperature of the focus ring 36 can be sufficiently decreased in the $SiO_2$ etching to thereby improve selectivity, vertical processability, and uniformity at the bottom of a contact hole.

Next, examples of a heating device used exclusively for heating the focus ring 36 in the plasma etching apparatus in accordance with the embodiment of the present invention will be described with reference to FIGS. 10 to 14.

Figure 10:
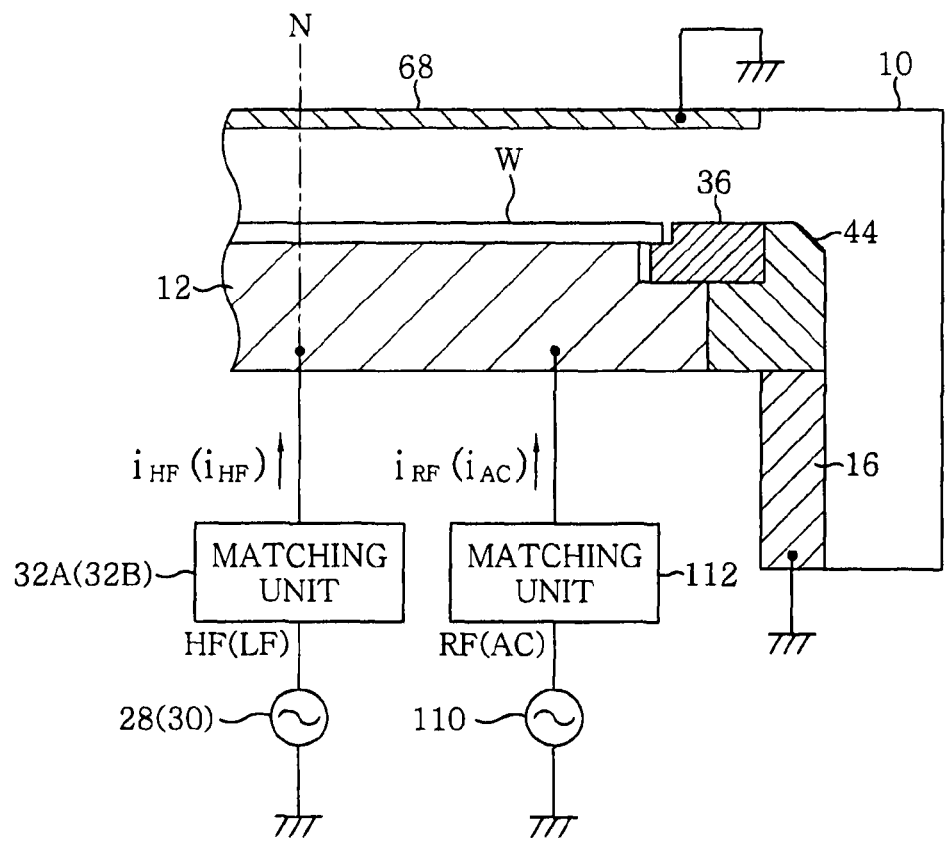
FIG. 10 illustrates an example of a heating device used exclusively to heat the focus ring.

In an example of FIG. 10, a third RF power supply 110 and a third matching unit 112 are used exclusively to heat the focus ring 36. An output terminal of the third matching unit 112 may be connected to the susceptor 12 via the power feed rod 34 as shown in FIG. 1.

The RF power outputted from the third RF power supply 110 may be set to have a frequency such that an impedance of the focus ring heating load 92 is minimum or extremely small. For instance, when the focus ring heating load 92 includes the capacitors $C_1$ to $C_4$ and the resistor R1 as shown in FIGS. 3 and 4, the RF may be set to have a frequency (e.g., 200 MHz or more) to decrease as much as possible a reactance of the capacitors $C_1$ to $C_4$. Further, when the focus ring heating load 92 has an inductance component, the RF power may be set to have a frequency equal to or close to the serial resonance frequency.

Figure 11:
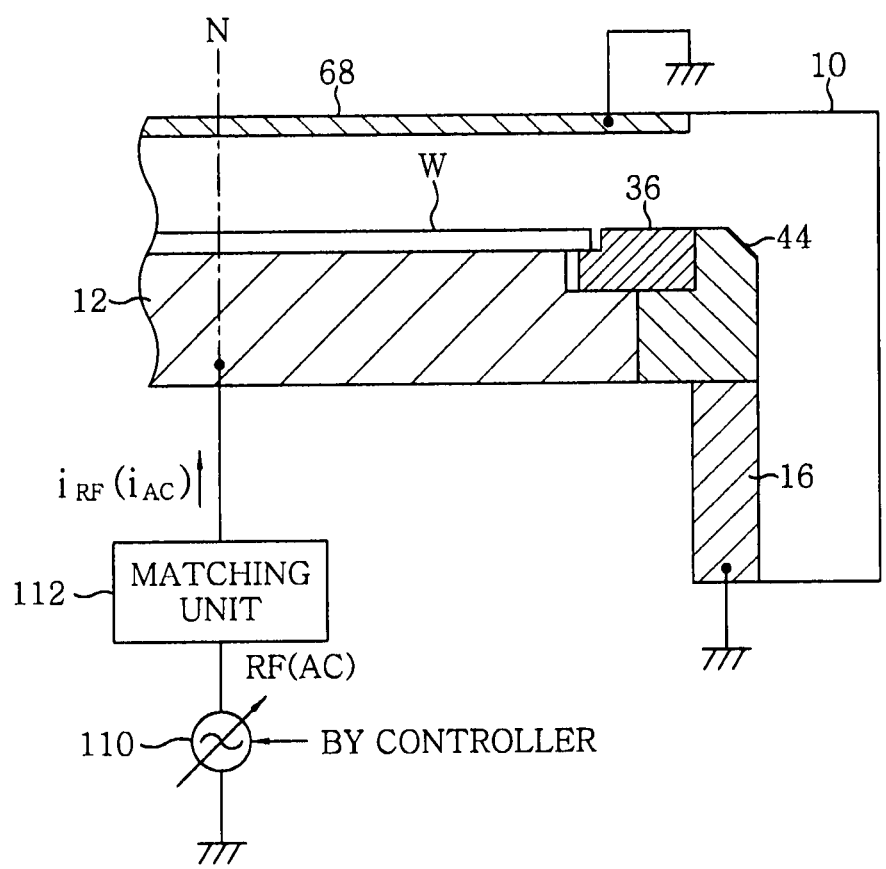
FIG. 11 represents a modification example of the example of FIG. 10.

FIG. 11 represents a modification example of the example of FIG. 10. In this modification example, a frequency-variable RF power supply is used as the third RF power supply 110. By varying the frequency of the third RF power supply 110, it is possible to allow RF current $i_{RF}$ flowing in the focus ring heating load 92 to be maximum or extremely large.

Figure 12:
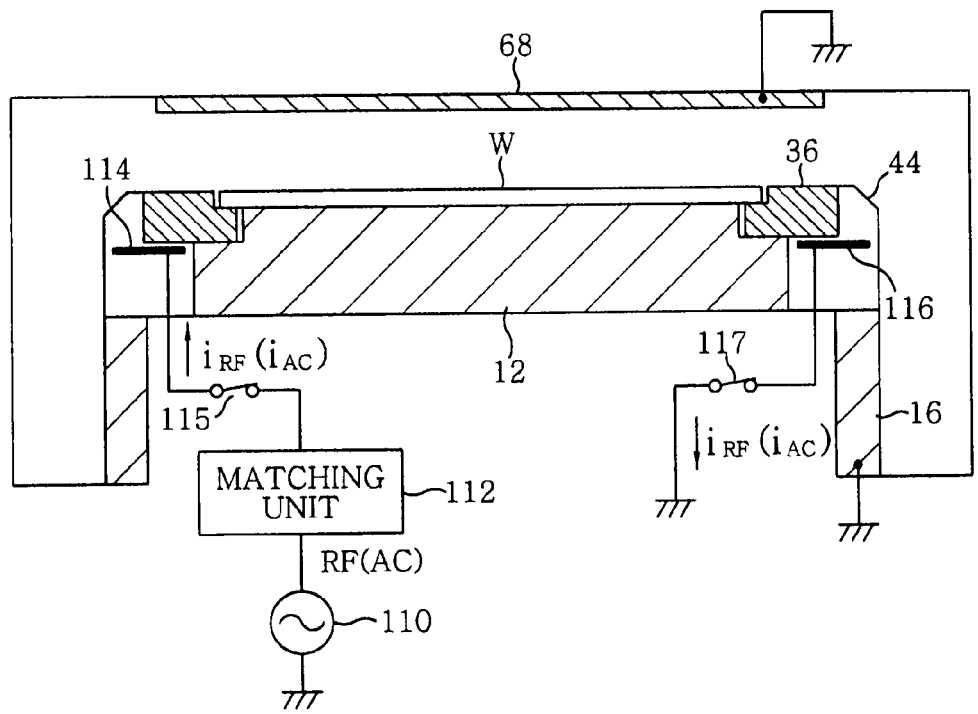
FIG. 12 illustrates another example of the focus ring heating device.
Figure 13A:
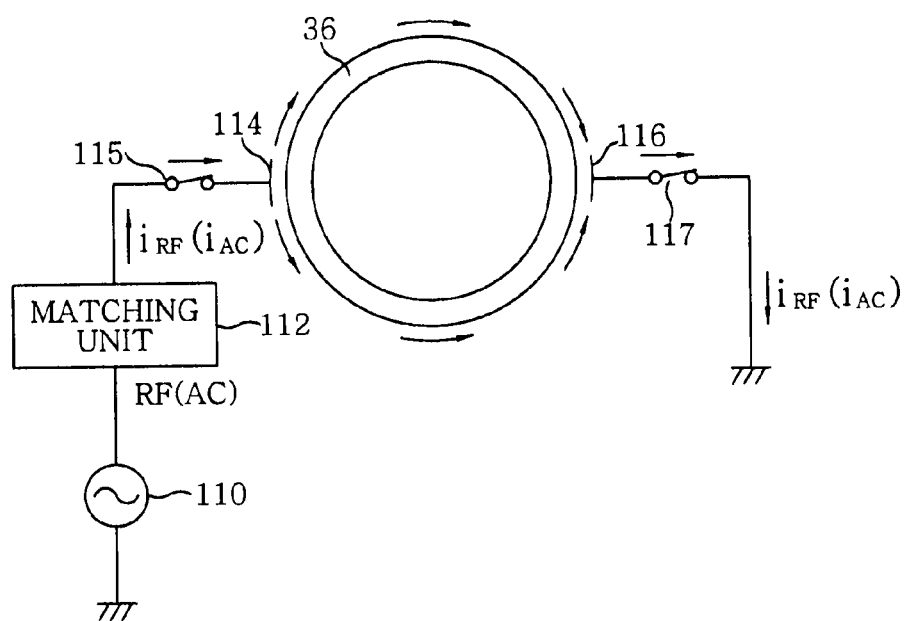
FIG. 13A shows an example of an RF current flow path in the focus ring heating device of FIG. 12.
Figure 13B:
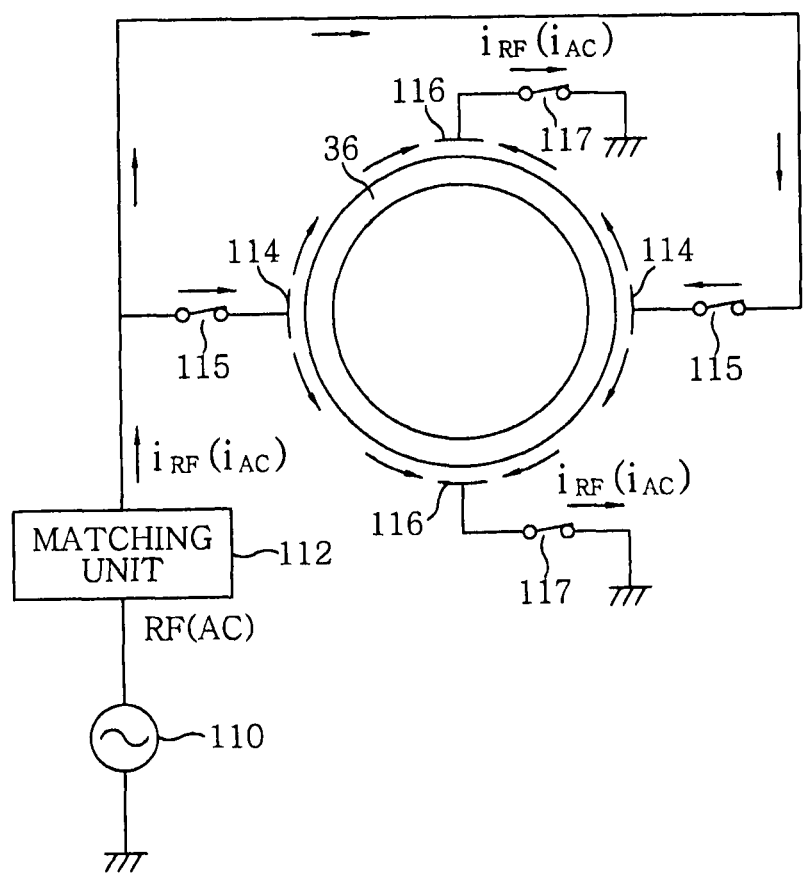
FIG. 13B shows another example of an RF current flow path in the focus ring heating device of FIG. 12.

FIGS. 12 to 13B illustrate another example of the focus ring heating device. The focus ring heating device allows the RF current iRF generated from the third RF power supply 110 to flow along the focus ring 36 in a circling direction without passing through the susceptor 12 instead of traversing the focus ring 36 in a radial direction through the susceptor 12. Specifically, as shown in FIG. 12, first and second terminals 114 and 116 are buried in the peripheral dielectric member 44 at different positions close to the focus ring 36 in a circling direction at intervals of 180° as shown in FIG. 13A or at intervals of 90° as shown in FIG. 13B. Further, the first terminal 114 is connected to an output terminal of the third matching unit 112 via a switch 115, and the second terminal 116 is connected to a conductive member having a ground potential (e.g., the chamber 10) via a switch 117.

In the above configuration, the first and second terminals 114 and 116 are capacitively coupled to the focus ring 36 at respective installation positions. When the RF power is outputted from the third RF power supply 110 by turning on both the switches 115 and 117, the RF current $i_{RF}$ flows along a path of the third RF power supply 110→the third matching unit 112→the switch 115→the first terminal 114→the focus ring 36→the second terminal 116→the member having a ground potential. The third matching unit 112 is operated to match an impedance of the third RF power supply 110 to an impedance of an RF transmission path from the first terminal 114 to the second terminal 116 through the focus ring 36, i.e., the focus ring heating load.

As a modification example, the first and second terminals 114 and 116 may be connected directly to the focus ring 36. Further, a commercial alternating current (AC) power supply may be used instead of the third RF power supply 110.

Figure 14:
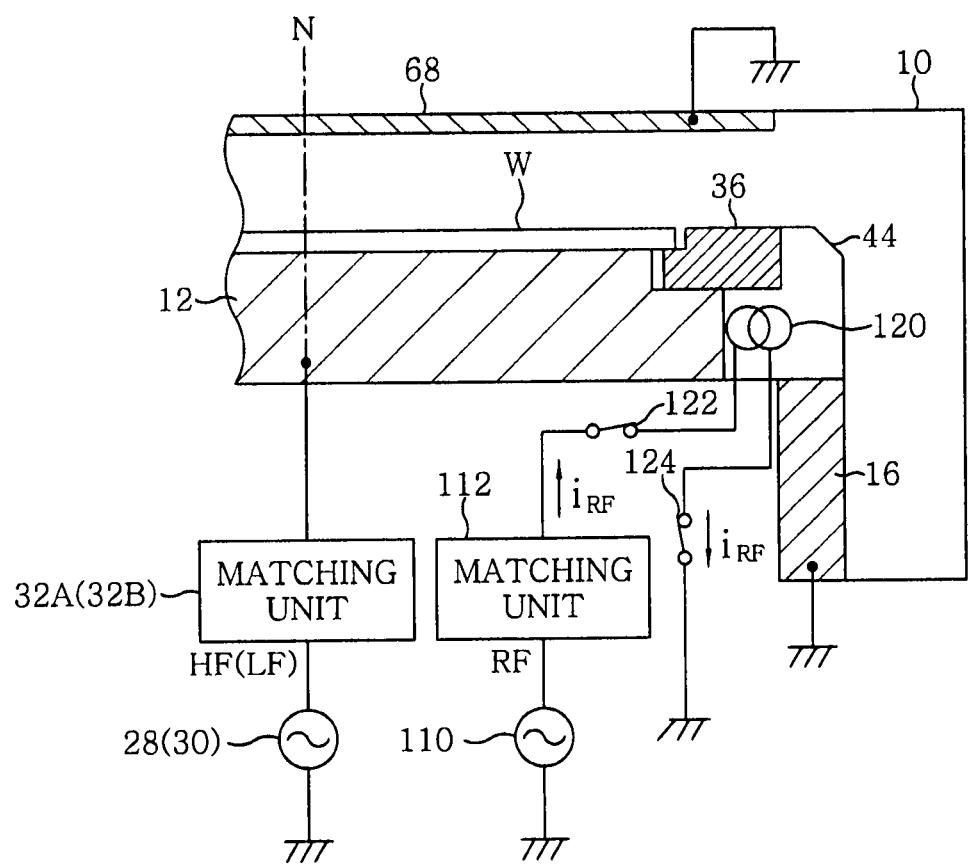
FIG. 14 illustrates still another example of the focus ring heating device.

FIG. 14 illustrates still another example using electromagnetic induction. In this example, a ring-shaped coil electrode 120 extending along the focus ring 36 is arranged in the vicinity of the focus ring 36, e.g., embedded in the peripheral dielectric member 44. One end of the coil electrode 120 is connected to an output terminal of the third RF power supply 110 via a switch 122. The other end of the coil electrode 120 is connected to a member having a ground potential (e.g., the chamber 10) via a switch 124. The switches 122 and 124 are turned on to allow the RF current $i_{RF}$ generated from the third RF power supply 110 to flow in the coil electrode 120. Accordingly, eddy current or dielectric loss is generated in the focus ring 36 by electromagnetic induction or inductive coupling, thereby heating the focus ring 36. The third matching unit 112 is operated to match an impedance of the third RF power supply 110 to an impedance of the focus ring heating load including the coil electrode 120 and the focus ring 36.

The third RF power supply 110 and the third matching unit 112 used exclusively to heat the focus ring 36 can be operated independently from the first RF power supply 28 and the first matching unit 32A for plasma generation or the second RF power supply 30 and the second matching unit 32B for ion attraction. Accordingly, the focus ring 36 can be heated not only while a plasma process in not performed in the chamber 10 but also while a plasma process in performed in the chamber 10. Also when there are provided the third RF power supply 110 and the third matching unit 112 used exclusively to heat the focus ring 36, it is, of course, possible to use the temperature sensor 43 and the temperature controller (one function of the controller 66) for controlling the temperature of the focus ring 36 by a feedback method.

While the invention has been shown and described with respect to the embodiment, it will be understood by those skilled in the art that other embodiments, various changes and modifications may be made without departing from the scope of the invention.

For example, although the lower plate dual RF application type capacitively coupled plasma etching apparatus has been described in the above embodiment, the present invention may be applied to other types of capacitively coupled plasma etching apparatuses.

For example, although not shown in the drawing, in a lower plate single RF application type capacitively coupled plasma etching apparatus in which the first RF power HF for plasma generation is applied to the susceptor 12 and the second RF power LF for ion attraction is not used, the first RF power HF can be used in RF heating of the focus ring 36 in the same way as the above-described embodiment.

Figure 15:
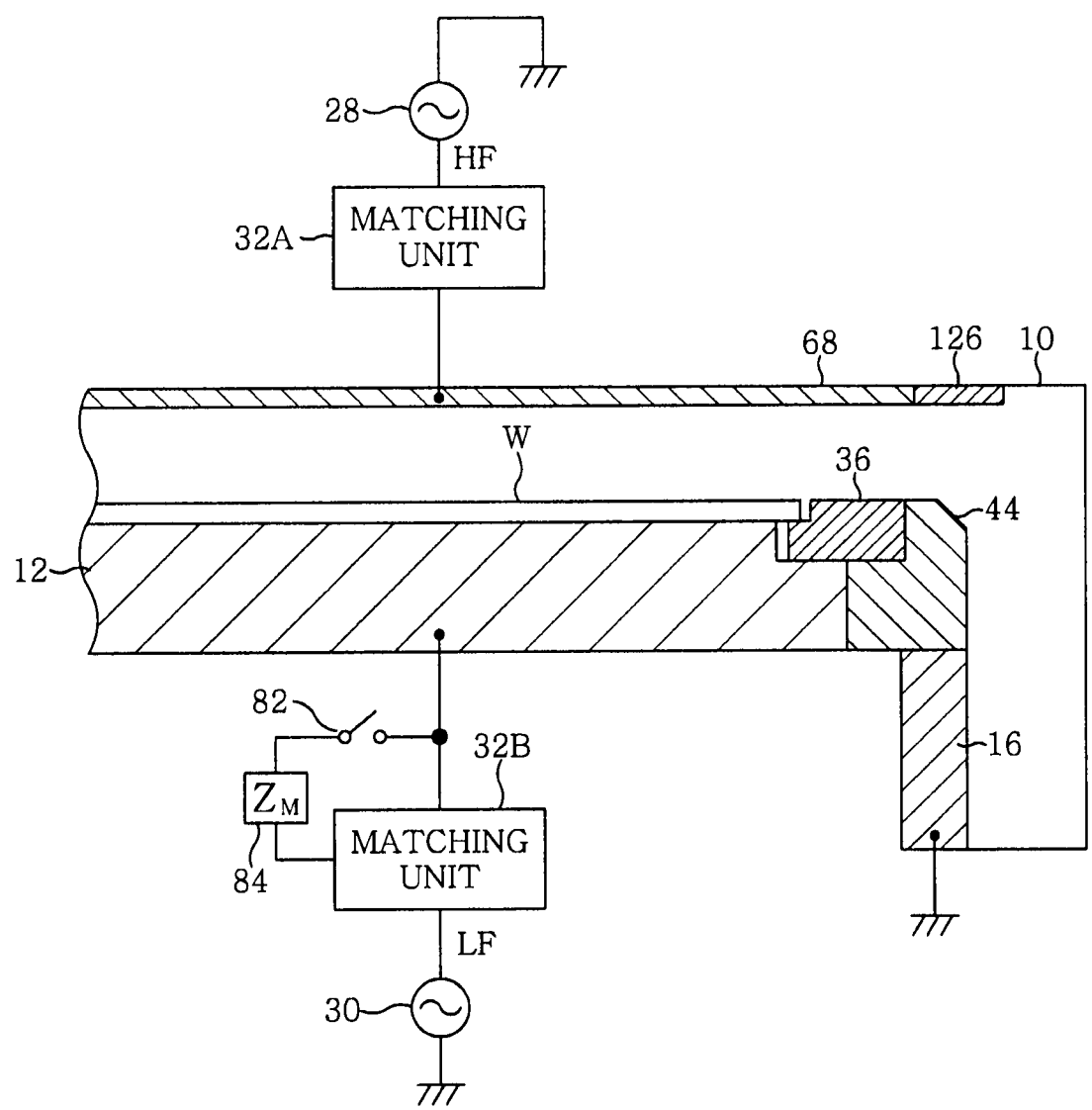
FIG. 15 is a partial longitudinal cross sectional view showing main parts of an upper-and-lower plate dual RF application type capacitively coupled plasma processing apparatus to which the present invention is applied.

Further, as shown in FIG. 15, in an upper-and-lower plate dual RF application type capacitively coupled plasma etching apparatus in which the first RF power HF for plasma generation is applied to the upper electrode 68 and the second RF power LF for ion attraction is applied to the lower electrode 12, the second RF power LF can be used in RF heating of the focus ring 36 in the same way as the above-described embodiment.

Figure 16:
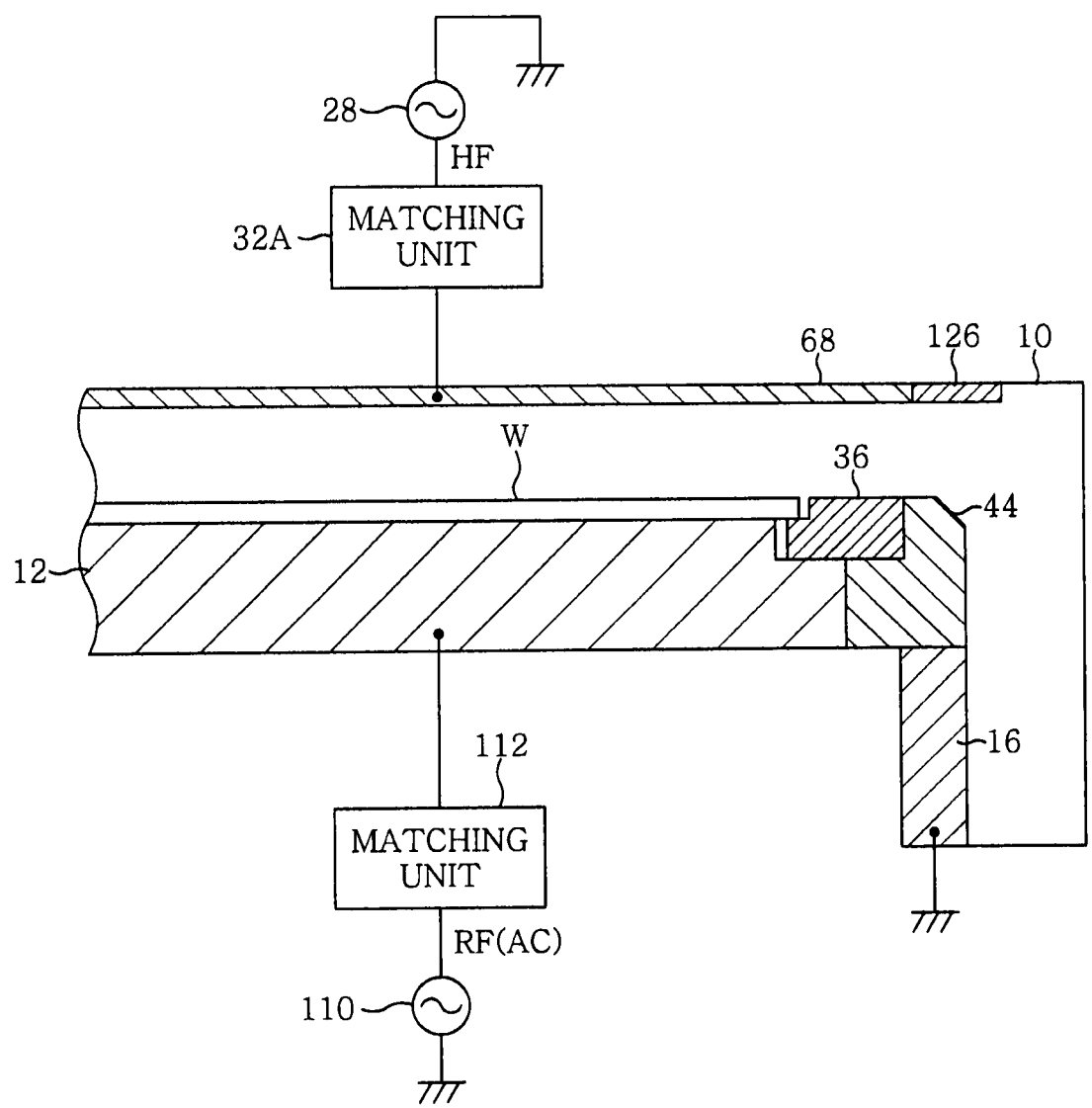
FIG. 16 is a partial longitudinal cross sectional view showing main parts of an upper plate single RF application type capacitively coupled plasma processing apparatus to which the present invention is applied.

Further, as shown in FIG. 16, in an upper plate single RF application type capacitively coupled plasma etching apparatus in which the first RF power HF for plasma generation is applied to the upper electrode 68 and the second RF power LF for ion attraction is not used, the third RF power used exclusively to heat the focus ring 36 can be used in RF heating of the focus ring 36 in the same way as the above-described embodiment.

Further, in FIGS. 15 and 16, the anode-coupled upper electrode 68 is attached to the chamber 10 via an insulator 126 to be electrically insulated from the chamber 10.

Further, in a lower plate triple RF application type capacitively coupled plasma etching apparatus in which three RF powers including the RF power for plasma generation and the RF power for ion attraction are applied to the lower electrode, it is possible to achieve RF heating of the focus ring 36 in the same way as the above-described embodiment.

Further, the present invention is not limited to the capacitively coupled plasma etching apparatus, and may also be applied to an inductively coupled plasma etching apparatus for generating a plasma in an inductive electromagnetic field by providing an antenna on or near the chamber, a microwave plasma processing apparatus for generating a plasma by using a microwave power and the like. Further, the present invention may be applied to other plasma processing apparatuses for performing plasma CVD, plasma oxidation, plasma nitriding, sputtering and the like. Moreover, a target substrate in the embodiment of the present invention is not limited to the semiconductor wafer, and various substrates for flat panel displays, a photomask, a CD substrate, a printed circuit board and the like may be used as a target substrate.

Figure 17A:
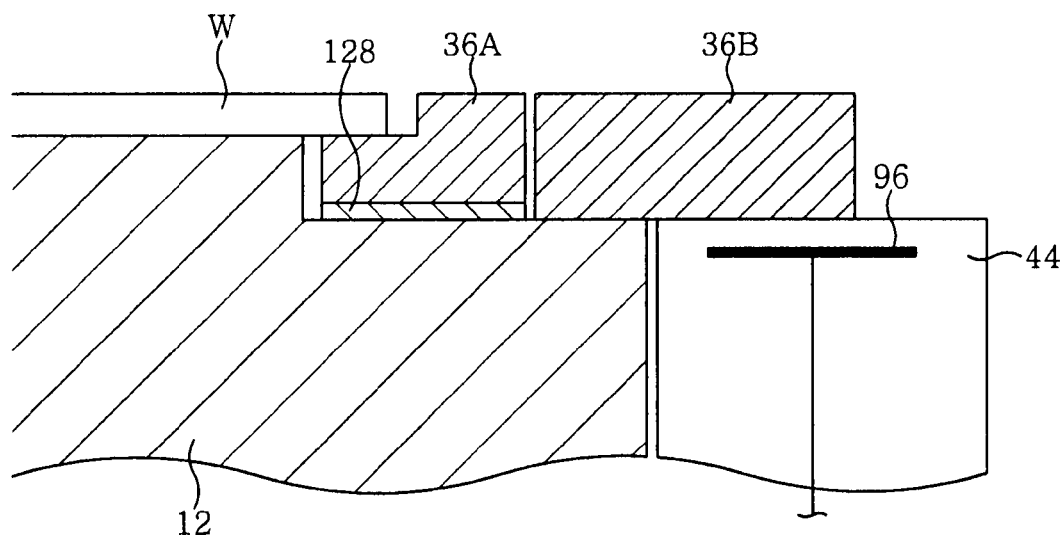
FIG. 17A is a partial longitudinal cross sectional view showing main parts of a plasma processing apparatus including a division type focus ring to which the present invention is applied.
Figure 17B:
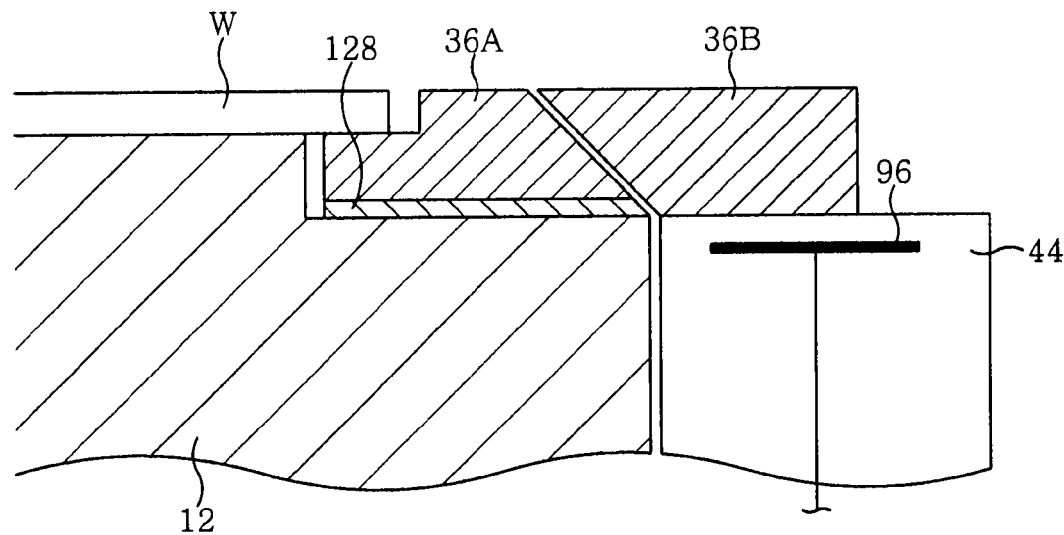
FIG. 17B is a partial longitudinal cross sectional view showing a modification example of the apparatus of FIG. 17A.

Further, various modifications and selections may be made in a shape, a structure and a material of each member, particularly, the focus ring and the peripheral dielectric member, in the plasma processing apparatus. For example, as shown in FIGS. 17A and 17B, a plurality of, e.g., two, concentric focus rings 36A and 36B on the inner side and the outer side in a radial direction may be attached to the susceptor 12.

In the divided focus ring structure, the inner focus ring 36A is thermally coupled to the top surface of the susceptor 12 via a heat transfer sheet 128 and the temperature of the inner focus ring 36A is controlled by a cooling device provided on the side of the susceptor 12. On the other hand, the outer focus ring 36B is electrically capacitively coupled to the susceptor 12, and thermal coupling between the outer focus ring 36B and the susceptor 12 is weak because the inside of the chamber 10 is maintained in a vacuum state.

In another aspect, the outer focus ring 36B forms an RF transmission path of the focus ring heating load 92 (FIGS. 3 and 4), whereas the inner focus ring 36A is substantially deviated from the RF transmission path of the focus ring heating load 92. That is, the outer focus ring 36B is included in the focus ring heating load 92, whereas the inner focus ring 36A is independent of the focus ring heating load 92.

In the divided focus ring structure, the temperatures of the inner focus ring 36A and the outer focus ring 36B can be independently controlled, thereby improving the controllability on the influence of the focus rings 36A and 36B on the semiconductor wafer W mounted on the susceptor 12 in plasma process characteristics (e.g., diametrical distribution or in-plane uniformity of an etching rate or deposition rate).

Figure 18:
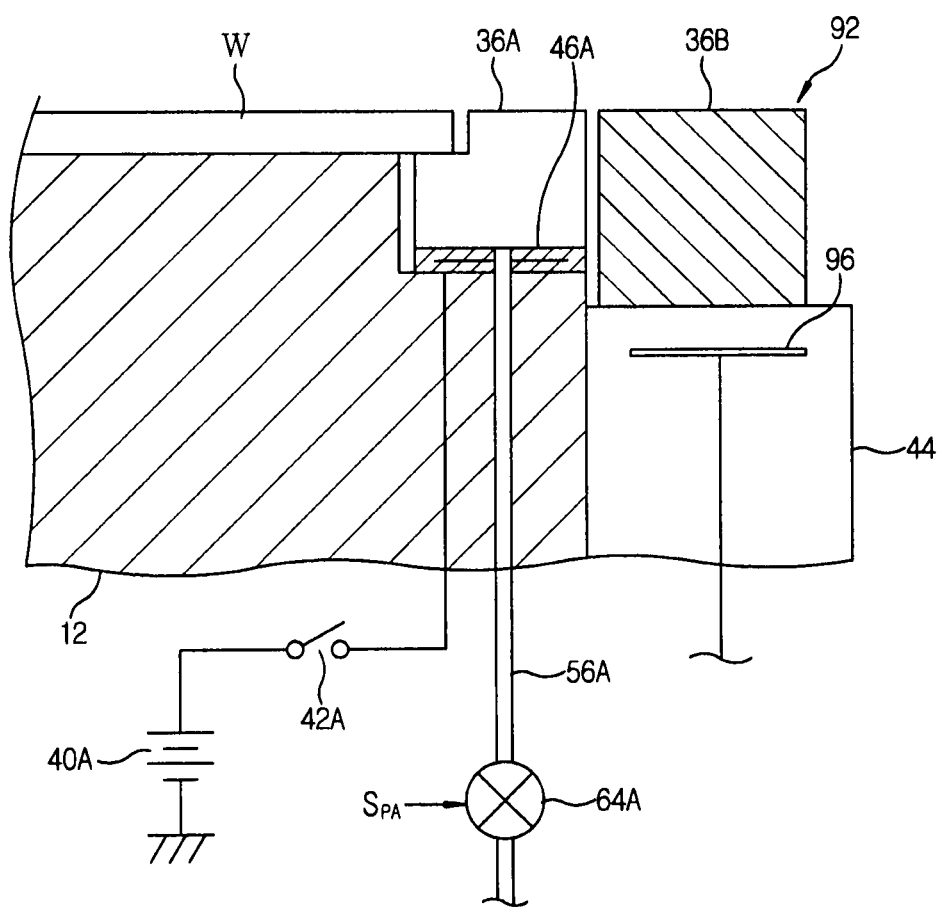
FIG. 18 is a partial longitudinal cross sectional view showing another example of the divided focus ring structure in accordance with the embodiment of the present invention.

In order to achieve independent control of the inner and outer focus rings 36A and 36B, instead of the heat transfer sheet 128 shown in FIGS. 17A and 17B, an inner peripheral electrostatic chuck 46A may be provided between the inner focus ring 36A and the susceptor 12 as shown in FIG. 18. In this case, a high voltage DC power supply 40A and a switch 42A for attracting and magnetizing the inner peripheral electrostatic chuck 46A are preferably provided independently of the DC power supply 40A and the switch 42 for the main electrostatic chuck 38.

In the example of FIG. 18, a heat transfer gas is supplied to an interface between the inner peripheral electrostatic chuck 46A and the inner focus ring 36A via a gas supply line 56A independent of the heat transfer gas supply unit 53 (FIG. 2). However, if sufficient thermal coupling can be obtained between the inner focus ring 36A and the susceptor 12 via the inner peripheral electrostatic chuck 46A, the heat transfer gas supply system (the gas supply line 56A and the valve 64A) may be omitted.

Further, in the example of FIG. 18, a lower inner peripheral surface of the outer focus ring 36B is arranged to face an upper outer peripheral surface of the susceptor 12, thereby increasing electrical coupling between the outer focus ring 36B and the susceptor 12 in the focus ring heating load 92.

Figure 19A:
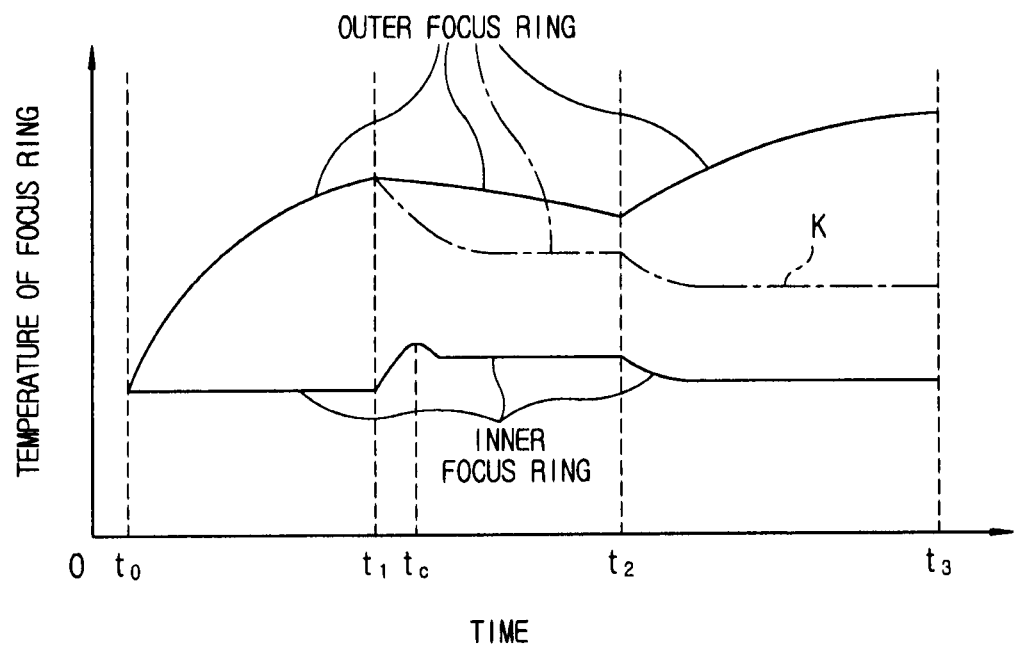
FIG. 19A illustrates an example of a method for controlling the temperature of the focus ring in the divided focus ring structure in accordance with the embodiment of the present invention.

FIG. 19A illustrates an example of a method for controlling the temperature of the focus ring in the divided focus ring structure. In the illustrated example, a plasma process including multiple steps is performed as in the above-described multilayer resist process (FIGS. 8A to 8D). During a first period $[t_0 \sim t_1]$, seasoning is performed before the start of the process. Then, a first step of the process is performed under specific conditions during a period $[t_1 \sim t_2]$, and a second step of the process is performed under specific conditions during a period $[t_2 \sim t_3]$.

In this case, in the seasoning period $[t_0 \sim t_1]$, when the focus ring heating load 92 is in an ON (electrically conducted) state, as shown in FIG. 19A, the outer focus ring 36B generates Joule heat to increase its temperature, but the inner focus ring 36A hardly generates Joule heat so that its temperature does not increase.

When the process is started, in the first step $[t_1 \sim t_2]$, the temperature of the inner focus ring 36A begins to be increased by the heat transferred from the plasma. For example, the inner focus ring 36A can be maintained at a predetermined temperature by turning on the inner peripheral electrostatic chuck 46A at a time point $T_C$. On the other hand, the outer focus ring 36B is maintained at a temperature higher than the temperature of the inner focus ring 36A by balancing the heat emitted during the seasoning period with the heat transferred from the plasma.

In the second step [$t_2$~$t_3$], the RF power applied to the plasma is further increased. Accordingly, the amount of heat transfer gas supplied to the inner focus ring 36A is further increased, and the temperature of the inner focus ring 36A is decreased to a lower level. On the other hand, the temperature of the outer focus ring 36B increases because the amount of heat transferred from the plasma to the outer focus ring 36B is much larger than the amount of heat emitted from the outer focus ring 36B.

Figure 19B:
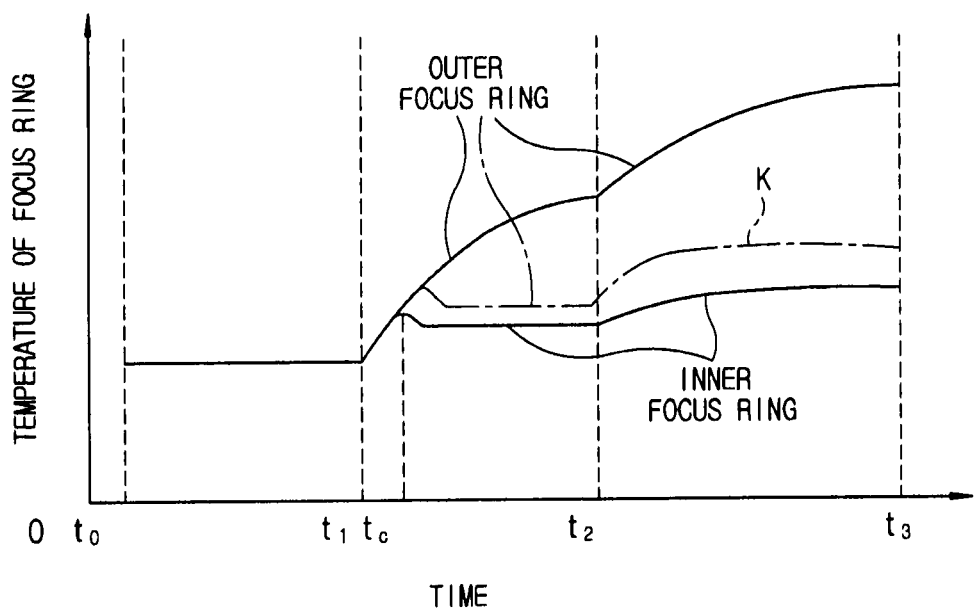
FIG. 19B illustrates another example of the method for controlling the temperature of the focus ring in the divided focus ring structure in accordance with the embodiment of the present invention.

As for another method for controlling the temperature of the focus ring, as shown in FIG. 19B, the focus ring heating load 92 is maintained in an OFF (electrically non-conducted) state in the seasoning period [$t_0$~$t_1$]. In this case, when the process is started, the temperatures of both the inner and outer focus rings 36A and 36B are increased by the heat transferred from the plasma. However, the inner focus ring 36A can be maintained at a predetermined temperature by turning on the inner peripheral electrostatic chuck 46A at a time point $T_C$. On the other hand, the temperature of the outer focus ring 36B continuously increases by the heat transferred from the plasma. In the second step [$t_2$~$t_3$], the amount of heat transfer gas supplied to the inner focus ring 36A is slightly reduced compared to the first step [$t_0$~$t_1$], so that the temperature of the inner focus ring 36A is increased to a slightly higher level.

Figure 20:
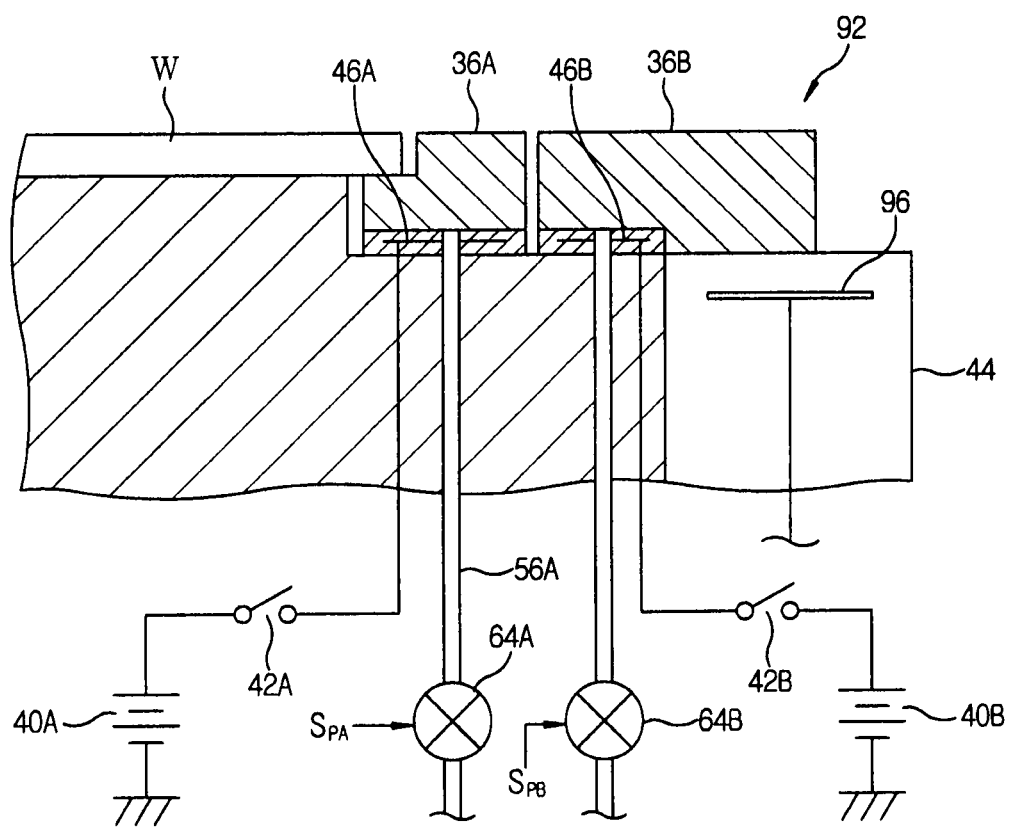
FIG. 20 is a partial longitudinal cross sectional view showing still another example of the divided focus ring structure in accordance with the embodiment of the present invention.

In an example of FIG. 20, the inner and outer focus rings 36A and 36B are mounted on the susceptor 12 via inner and outer peripheral electrostatic chucks 46A and 46B that are independent of each other, respectively. Also in this case, the outer focus ring 36B is included in the focus ring heating load 92, whereas the inner focus ring 36A is independent of the focus ring heating load 92.

As described above, the independent outer peripheral electrostatic chuck 46B and a voltage applying unit (a DC power supply 40B and a switch 42B) are provided between the outer focus ring 36B and the susceptor 12. More preferably, an independent heat transfer gas supply system (a gas supply line 56B and a valve 64B) may be provided for the outer focus ring 36B. Accordingly, the temperature of the outer focus ring 36B can be more freely controlled. For example, the temperature of the outer focus ring 36B can be controlled as represented by a dashed dotted line K in the examples of FIGS. 19A and 19B.

Further, in the above-described divided focus ring structure (FIGS. 17A to 20), it is preferable that the resistivity of the inner focus ring 36A that is not included in the focus ring heating load 92 is low and the resistivity of the outer focus ring 36B that is included in the focus ring heating load 92 is high.

This is because it is difficult to heat the focus ring even though the same amount of current flows if the resistivity of the focus ring is low. This is apparent from the following equation:

$$P = I^2 \times R$$

where P is power, I is current, and R is resistance.

Further, it is preferable that the resistivity of the inner focus ring 36A is equal to or lower than, e.g., 2 Ωcm and the resistivity of the outer focus ring 36B is equal to or higher than, e.g., 50 Ωcm. Accordingly, it is possible to more selectively heat the outer focus ring 36B.

In the plasma processing apparatus in accordance with the embodiment of the present invention, it is possible to freely, easily and efficiently heat the focus ring mounted on the susceptor to surround a target substrate and to control the temperature of the focus ring independently from the temperature of the susceptor.

Further, in the plasma processing method in accordance with the embodiment of the present invention, it is possible to freely control the temperature of the focus ring in a multilayer resist process, thereby improving uniformity of etching characteristics.

What is claimed is:

1. A plasma processing apparatus comprising:
a vacuum evacuable processing chamber;
a lower electrode for mounting a target substrate in the processing chamber, the lower electrode including a peripheral portion which extends radially outwardly beyond an outer periphery of the substrate;
a focus ring mounted on the lower electrode to cover at least a portion of the peripheral portion of the lower electrode, and wherein the focus ring is coupled to an electrically grounded conductive member embedded within a dielectric member located outwardly in a radial direction from the lower electrode to surround the lower electrode;
an upper electrode disposed to face the lower electrode in parallel in the processing chamber;
a processing gas supply unit for supplying a processing gas to a processing space formed between the upper electrode and the lower electrode to perform a plasma process on the substrate;
a radio frequency (RF) power supply for outputting an RF power of a frequency appropriate for gas RF discharge;
a plasma generating RF power supply section for supplying the RF power outputted from the RF power supply to a first load configured to generate a plasma of the processing gas by RF discharge in the processing space in an impedance matching state;
a focus ring heating RF power supply section for supplying the RF power outputted from the RF power supply to a second load configured to heat the focus ring to a desired temperature in an impedance matching state, the second load including an RF transmission path from the lower electrode to the electrically grounded conductive member through the focus ring and the dielectric member; and
an impedance controlling unit configured to variably control an impedance in the RF transmission path of the second load with respect to the RF power supply,
wherein the impedance controlling unit is positioned along the RF transmission path and between the grounded conductive member and ground.

2. The plasma processing apparatus of claim 1, wherein a ground terminal that is electrically and capacitively coupled to the focus ring is provided at a peripheral portion of the focus ring located outward in a radial direction from the lower electrode,
wherein the impedance controlling unit further comprises a switch provided between the ground terminal and a ground potential,
wherein the impedance controlling unit is configured to turn on the switch such that the ground terminal is electrically grounded when the RF power is used for heating of the focus ring, and is configured to turn off the switch such that the ground terminal is in an electrically floating state when the RF power is used for generation of the plasma, and wherein the second load includes an RF transmission path from the lower electrode to the ground potential through the focus ring, the ground terminal and the switch.

3. The plasma processing apparatus of claim 1, wherein the plasma generating RF power supply section includes a matching unit electrically connected between the RF power supply and the lower electrode, the focus ring heating RF power supply section includes an impedance additional circuit having a predetermined impedance with the matching unit and an additional switch, and wherein the impedance controlling unit is configured to turn on the additional switch such that the impedance additional circuit is connected to the matching unit in series or in parallel when the RF power is used for heating of the focus ring, and is configured to turn off the additional switch such that the impedance additional circuit is electrically separated from the matching unit when the RF power is used for generation of the plasma.

4. The plasma processing apparatus of claim 3, wherein an impedance of the impedance additional circuit is set such that a matching point obtained in the matching unit when the RF power is used for heating of the focus ring is close to a matching point obtained in the matching unit when the RF power is used for generation of the plasma.

5. The plasma processing apparatus of claim 1, wherein the focus ring is made of Si, SiC or C.

6. The plasma processing apparatus of claim 1, further comprising a temperature sensor for detecting a temperature of the focus ring, and a temperature controller for controlling a level of the RF power used for heating of the focus ring by a feedback method using an output signal of the temperature sensor as a feedback signal to control the temperature of the focus ring.

7. The plasma processing apparatus of claim 1, further comprising a cooling device for cooling the lower electrode, and a thermal coupling controller for coupling the focus ring with the lower electrode as required or for a certain period of time.

8. The plasma processing apparatus of claim 7, wherein the thermal coupling controller includes an electrostatic chuck provided on a top surface of the lower electrode to attract and hold the focus ring by an electrostatic force, and a heat transfer gas supply unit for supplying a heat transfer gas to an interface between the electrostatic chuck and the focus ring through holes respectively formed in the lower electrode and the electrostatic chuck.

9. The plasma processing apparatus of claim 7, further comprising a temperature sensor for detecting a temperature of the focus ring, and a temperature controller for controlling at least one of a level of the RF power used for heating of the focus ring and a temperature of the lower electrode by a feedback method using an output signal of the temperature sensor as a feedback signal to control the temperature of the focus ring.

10. The plasma processing apparatus of claim 1, further comprising a matching network, wherein the impedance of the second load is outside any impedance of the matching network.

* * * * *

UNITED STATES PATENT AND TRADEMARK OFFICE
CERTIFICATE OF CORRECTION

PATENT NO.         : 8,894,806 B2                                                            Page 1 of 1
APPLICATION NO.    : 12/732711
DATED              : November 25, 2014
INVENTOR(S)        : Chishio Koshimizu et al.

It is certified that error appears in the above-identified patent and that said Letters Patent is hereby corrected as shown below:

On the title page, item (56) References Cited U.S. PATENT DOCUMENTS,
add --2003/0201069 A1* 10/2003 Johnson ......... 156/345.43--.

Signed and Sealed this
Twenty-ninth Day of December, 2015

Michelle K. Lee
*Director of the United States Patent and Trademark Office*